United States Patent
Yamada et al.

(10) Patent No.: US 9,297,511 B2
(45) Date of Patent: Mar. 29, 2016

(54) MEMBER FOR CONTROLLING LUMINOUS FLUX, LIGHT-EMITTING DEVICE, AND ILLUMINATION DEVICE

(75) Inventors: Kyouhei Yamada, Saitama (JP); Noriyuki Kawahara, Saitama (JP)

(73) Assignee: Enplas Corporation, Saitama (JP)

(*) Notice: Subject to any disclaimer, the term of this patent is extended or adjusted under 35 U.S.C. 154(b) by 126 days.

(21) Appl. No.: 14/128,685

(22) PCT Filed: Jun. 8, 2012

(86) PCT No.: PCT/JP2012/003758
§ 371 (c)(1), (2), (4) Date: Dec. 23, 2013

(87) PCT Pub. No.: WO2012/176393
PCT Pub. Date: Dec. 27, 2012

(65) Prior Publication Data
US 2014/0146546 A1  May 29, 2014

(30) Foreign Application Priority Data

Jun. 22, 2011 (JP) .................................. 2011-138370
Sep. 27, 2011 (JP) .................................. 2011-210277

(51) Int. Cl.
*F21V 5/00* (2015.01)
*F21V 5/04* (2006.01)
(Continued)

(52) U.S. Cl.
CPC .............. *F21V 5/04* (2013.01); *G02B 19/0014* (2013.01); *G02B 19/0061* (2013.01); *H01L 33/58* (2013.01); *F21Y 2101/02* (2013.01)

(58) Field of Classification Search
CPC ....... F21V 5/04; H01L 33/58; G02B 19/0014; G02B 19/0061; F21Y 2101/02
See application file for complete search history.

(56) References Cited

U.S. PATENT DOCUMENTS 7,390,117 B2*  6/2008  Leatherdale et al. ......... 362/555
2003/0107901 A1*  6/2003  Tokoro et al. ................. 362/538
(Continued)

FOREIGN PATENT DOCUMENTS

JP     2007-227410 A    9/2007
JP     2009-152142 A    7/2009
(Continued)

OTHER PUBLICATIONS

English translation of Informal Comments filed on Nov. 14, 2012 as a reply to the Written Opinion of the International Searching Authority issued for PCT/JP20121003758.

*Primary Examiner* — Andrew Coughlin
(74) *Attorney, Agent, or Firm* — Brundidge & Stanger, P.C.

(57) ABSTRACT

A member for controlling luminous flux (100) has an incidence surface (110) and an emitting surface (120). The incidence surface (110) is a pyramidal surface having a recessed shape relative to the bottom of the member for controlling luminous flux (100), and having rounded borders between the individual facets. The horizontal cross-section of the incidence surface (110) is substantially similar in shape to that of an n-hedral irradiated surface (410). In the horizontal cross-section of the emitting surface (120), each of the straight lines connecting together adjacent angles of the n angles that correspond to the n angles of the irradiated surface (410) is substantially parallel to the side that corresponds to the horizontal cross-section of the incidence surface (110). The horizontal cross-section of the emitting surface (120) is the same as the n-hedron formed by the straight lines in the cross section, or fits inside the n-hedron.

12 Claims, 20 Drawing Sheets

(51) Int. Cl.
*H01L 33/58* (2010.01)
*G02B 19/00* (2006.01)
*F21Y 101/02* (2006.01)

(56) References Cited

U.S. PATENT DOCUMENTS

2008/0007966 A1  1/2008  Ohkawa
2008/0101063 A1* 5/2008  Koike et al. .................. 362/231
2008/0174996 A1* 7/2008  Lu et al. ........................ 362/235
2011/0063874 A1* 3/2011  Yatsuda et al. ................ 362/612
2011/0075428 A1  3/2011  Chen et al.

FOREIGN PATENT DOCUMENTS

JP  2009-176471 A  8/2009
JP  2011-054756 A  3/2011
JP  2011-077518 A  4/2011

* cited by examiner

MEMBER FOR CONTROLLING LUMINOUS FLUX, LIGHT-EMITTING DEVICE, AND ILLUMINATION DEVICE

TECHNICAL FIELD

The present invention relates to a light flux controlling member that controls distribution of light emitted from a light emitting element. In addition, the present invention relates to a light emitting apparatus having the light flux controlling member and an illumination apparatus having the light emitting apparatus.

BACKGROUND ART

In recent years, from the viewpoint of energy saving, light-emitting diodes (LEDs) have been used as light sources for lighting, in place of fluorescent lights, halogen lamps, and the like.

When a surface to be irradiated is irradiated using a light-emitting diode, illuminance varies greatly between a location immediately below a light source (light-emitting diode) and a location separated from the light source. Therefore, when a wide surface to be irradiated is irradiated using one light-emitting diode, illuminance varies greatly between a location immediately below a light source and a rim part of the surface to be irradiated. As a method of uniformly illuminating a wide surface to be irradiated using a light-emitting diode, there has been consideration of the dense arrangement of a plurality of light-emitting diodes. However, such a method is not preferable from the viewpoint of energy saving.

In addition, as another method of uniformly illuminating a wide surface to be irradiated using a light-emitting diode, there has been consideration of the expansion of the distribution of light emitted from the light-emitting diode using a lens (for example, see Patent Literature 1). Patent Literature 1 discloses a light emitting element unit including a light emitting element, and a lens unit that expands the distribution of light from the light emitting element. The lens unit includes an incidence surface on which the light from the light emitting element is incident, and an emission surface from which the light incident thereon from the incidence surface spreads out. The lens unit has a rotationally-symmetrical shape (circularly-symmetrical shape) using an optical axis of the light emitting element as a central axis. Therefore, the lens unit has a circular shape when seen in a plan view. It is possible to uniformly irradiate a wide surface to be irradiated with light from a light emitting element to a certain extent, by using the light emitting element unit disclosed in Patent Literature 1.

CITATION LIST

Patent Literature

PTL 1
Japanese Patent Application Laid-Open No. 2009-152142

SUMMARY OF INVENTION

Technical Problem

When a planar surface to be irradiated is irradiated with light using the light emitting element unit disclosed in Patent Literature 1, an irradiation area of the light has a substantially circular shape. Therefore, when a rectangular surface to be irradiated is irradiated with light using the light emitting element unit disclosed in Patent Literature 1, there is a concern that four corners of the surface to be irradiated may be darkened. In addition, when there is an attempt to sufficiently irradiate the four corners of the surface with light, the light spreads more than necessary, and thus the light may be wasted.

In this manner, when a light flux controlling member (lens) of the related art is used, it is not possible to effectively irradiate a polygonal-shaped surface to be irradiated with light emitted from a light emitting element.

An object of the present invention is to provide a light flux controlling member that can uniformly and effectively irradiate a polygonal (n-sided polygon: n is an integer equal to or greater than 3) surface to be irradiated with light emitted from a light emitting element. In addition, another object of the present invention is to provide a light emitting apparatus having the light flux controlling member, and an illumination apparatus having the light emitting apparatus.

Solution to Problem

There is provided a light flux controlling member that controls distribution of light emitted from a light emitting element, the member including: an incidence surface on which the light emitted from the light emitting element is incident; and an emission surface from which the light incident thereon from the incidence surface is emitted toward a surface to be irradiated which has an n-sided polygonal shape, in which the incidence surface is a pyramidal surface formed in a concave shape with respect to a bottom located on an opposite side to the emission surface, at a position of the bottom which corresponds to the light emitting element, the pyramidal surface being configured such that a boundary between surfaces thereof is an R surface, in which a shape of a cross-section of the incidence surface, the cross-section of the incidence surface being perpendicular to an optical axis of the light emitting element, is substantially similar to a shape of the surface to be irradiated, in which in a cross-section of the emission surface, the cross-section of the emission surface being perpendicular to an optical axis of the light emitting element, straight lines connecting corners adjacent to each other in n corners respectively corresponding to n corners of the surface to be irradiated are substantially parallel to corresponding sides of the cross-section of the incidence surface, and in which in the cross-section of the emission surface, the cross-section of the emission surface is the same as an n-sided polygon defined by the straight lines connecting the corners which are adjacent to each other in the n corners corresponding to the n corners of the surface to be irradiated, or is included in the n-sided polygon.

There is also provided a light emitting apparatus including: the light flux controlling member; and a light emitting element, in which the light flux controlling member is disposed in such a manner that an optical axis of the light emitting element passes through an apex of the pyramidal surface.

There is also provided an illumination apparatus including: the light emitting apparatus; and a polygonal-shaped surface to be irradiated which is irradiated with light from the light emitting apparatus, in which the light emitting apparatus is disposed in such a manner that the optical axis of the light emitting element and the surface to be irradiated are perpendicular to each other.

Advantageous Effects of Invention

A light emitting apparatus including a light flux controlling member of the present invention can uniformly and effectively irradiate a polygonal-shaped surface to be irradiated with light emitted from a light emitting element. In addition, an illumination apparatus of the present invention can uniformly and effectively illuminate a polygonal-shaped surface to be irradiated with light.

DESCRIPTION OF EMBODIMENTS

Hereinafter, embodiments of the present invention will be described in detail with reference to the accompanying drawings. In the following description, as representative examples of a light flux controlling member of the present invention, an illumination lens will be described which can effectively irradiate a square (n-sided polygon: n=4)-shaped surface to be irradiated with light emitted from a light emitting element.

Meanwhile, "square-shaped surface to be irradiated" in this specification is a surface that is to be irradiated with light, and refers to a surface having a square-shaped irradiation area of light. Therefore, the "square-shaped surface to be irradiated" is not limited to a square-shaped flat plate. For example, when a circular flat plate is irradiated with light in a square shape, a surface to be irradiated with light corresponds to a "square-shaped surface to be irradiated".

(Embodiment 1)
[Configuration of Illumination Lens and Light Emitting Apparatus]

Figure 1A:
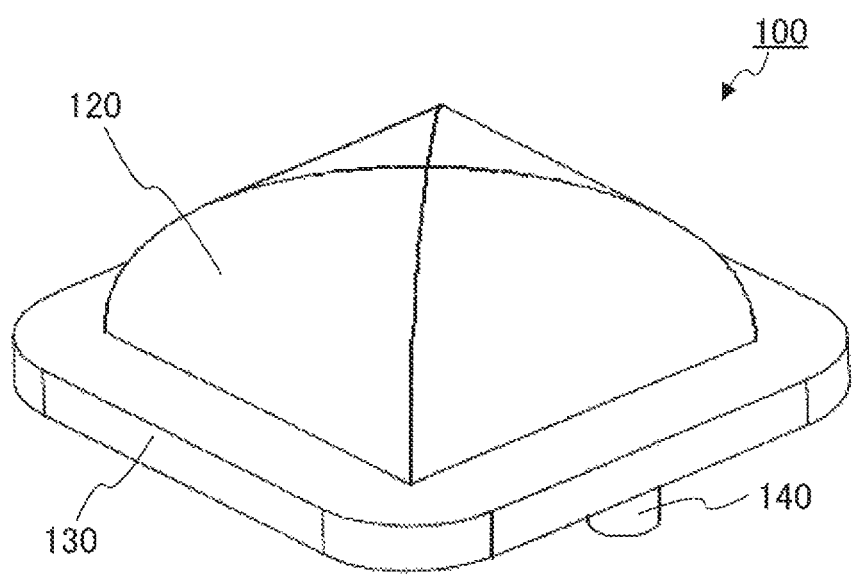
FIG. 1A is a top perspective view of an illumination lens according to Embodiment 1.
Figure 1B:
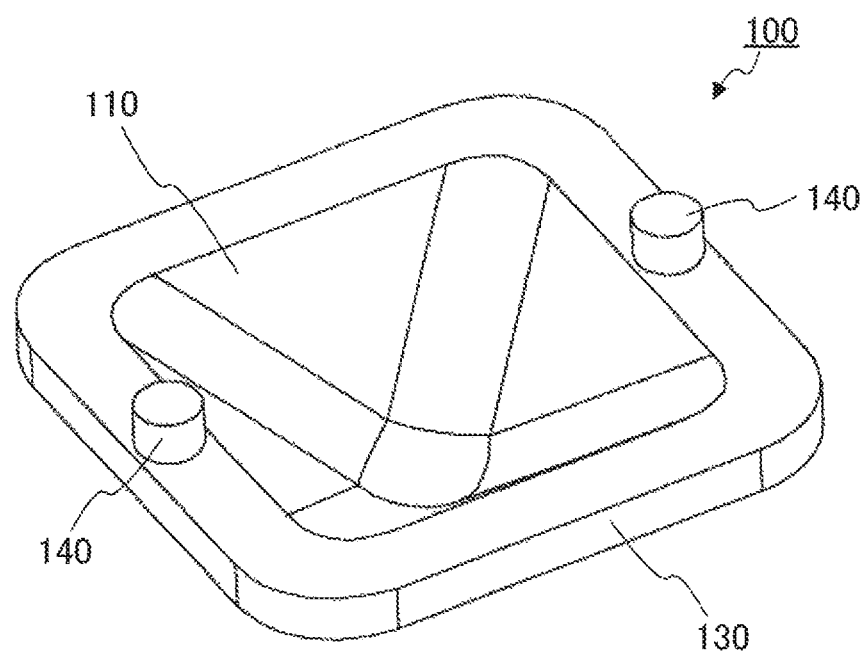
FIG. 1B is a bottom perspective view of the illumination lens according to Embodiment 1.
Figure 2A:
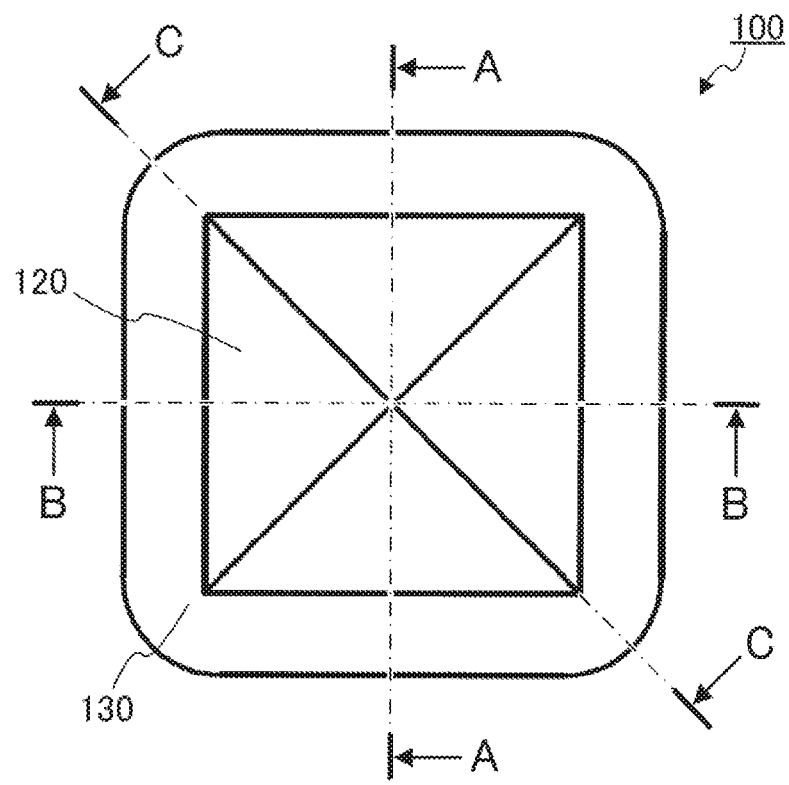
FIG. 2A is a plan view of the illumination lens according to Embodiment 1.
Figure 2B:
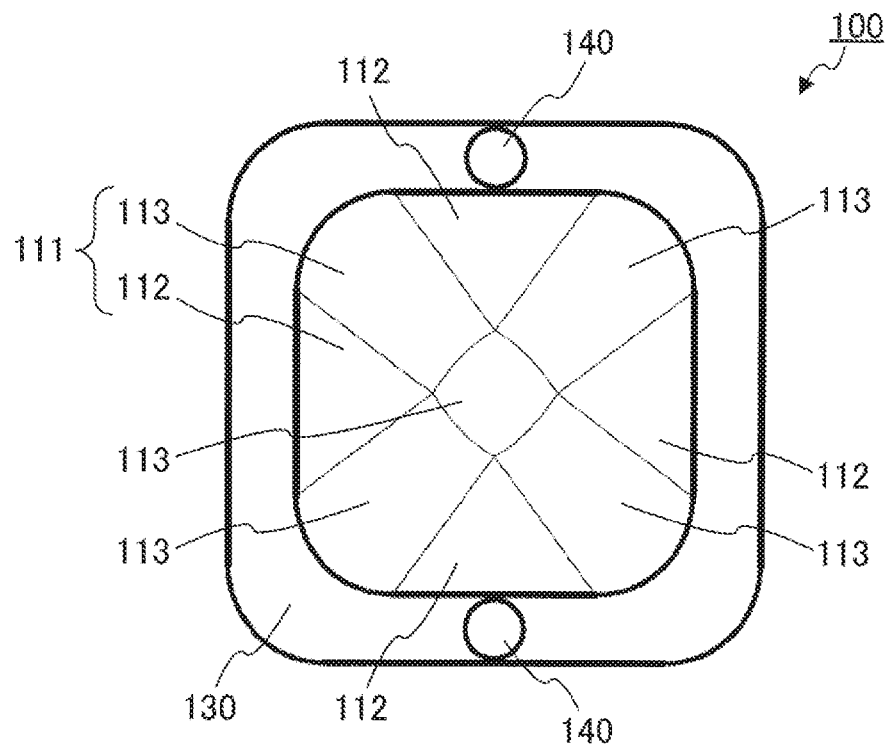
FIG. 2B is a bottom view of the illumination lens according to Embodiment 1.
Figure 3A:
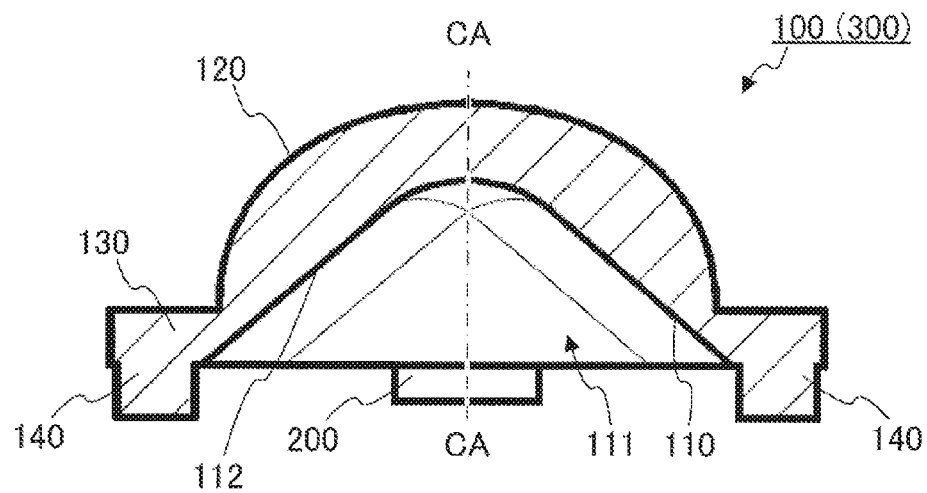
FIG. 3A is a cross-sectional view taken along line A-A illustrated in FIG. 2A.
Figure 3B:
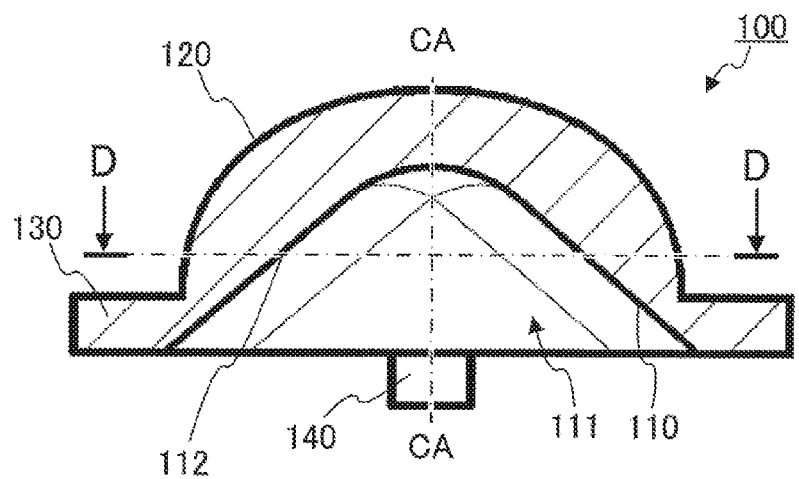
FIG. 3B is a cross-sectional view taken along line B-B illustrated in FIG. 2A.
Figure 3C:
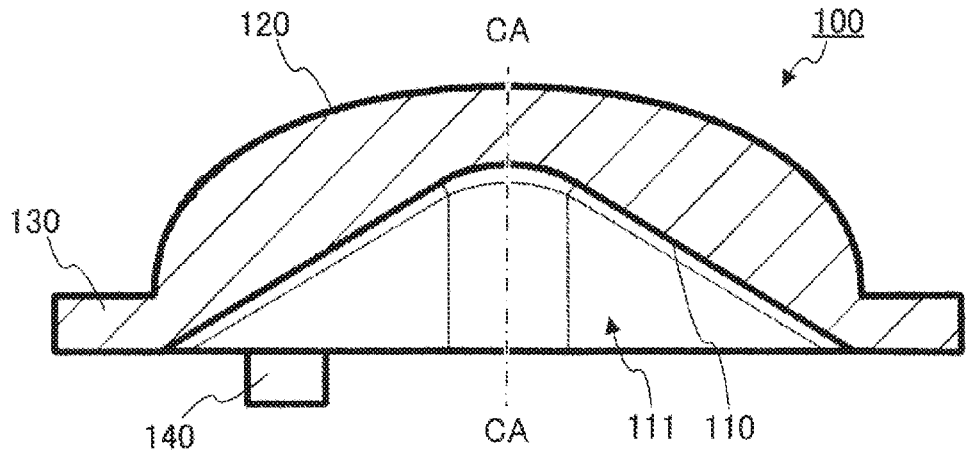
FIG. 3C is a cross-sectional view taken along line C-C illustrated in FIG. 2A.
Figure 4:
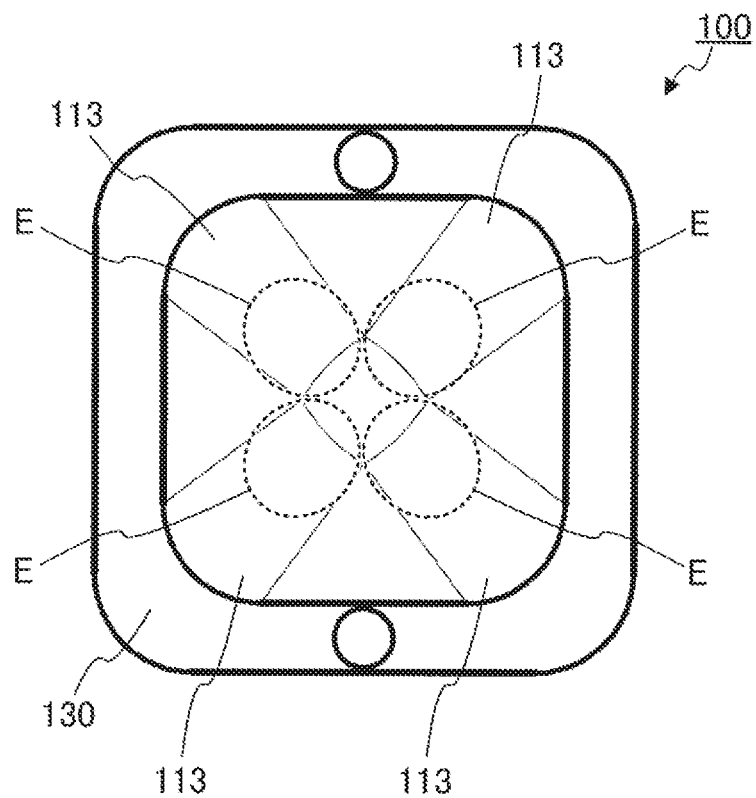
FIG. 4 is a bottom view of the illumination lens according to Embodiment 1 for illustrating a roughened region.
Figure 5:
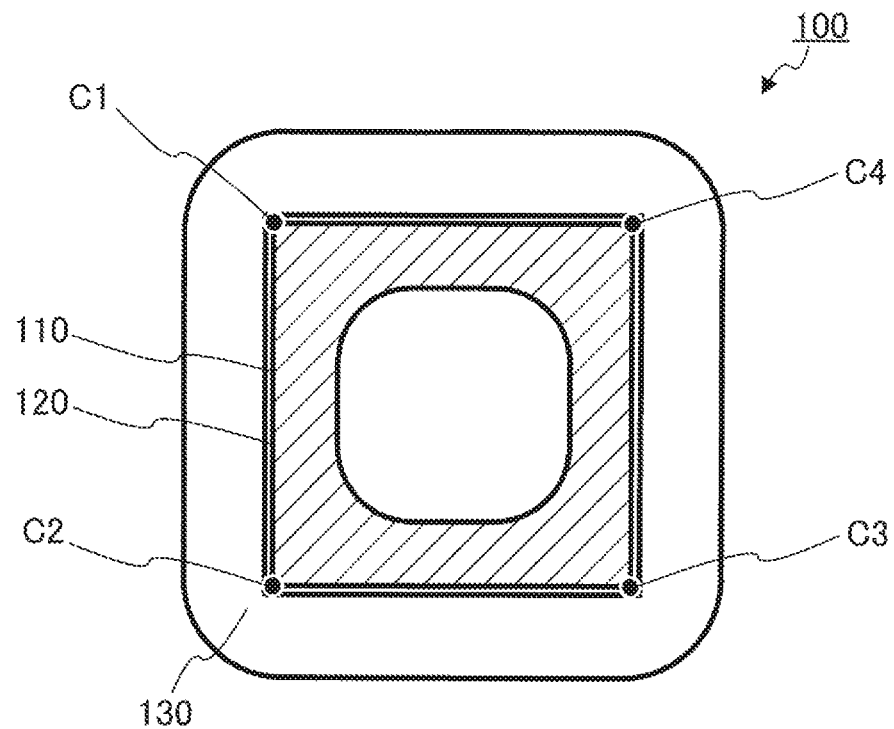
FIG. 5 is a cross-sectional view taken along line D-D illustrated in FIG. 3B.

FIG. 1 to FIG. 5 are diagrams illustrating a configuration of illumination lens 100 according to Embodiment 1. FIG. 1A is a top perspective view of illumination lens 100, and FIG. 1B is a bottom perspective view of illumination lens 100. FIG. 2A is a plan view of illumination lens 100, FIG. 2B and FIG. 4 are bottom views of illumination lens 100. FIG. 3A is a cross-sectional view taken along line A-A illustrated in FIG. 2A, FIG. 3B is a cross-sectional view taken along line B-B illustrated in FIG. 2A, and FIG. 3C is a cross-sectional view taken along line C-C illustrated in FIG. 2A. FIG. 5 is a cross-sectional view taken along line D-D illustrated in FIG. 3B.

Meanwhile, FIG. 3A illustrates light emitting element 200 together with illumination lens 100. That is, FIG. 3A is a cross-sectional view of light emitting apparatus 300 according to Embodiment 1.

As illustrated in FIG. 1 to FIG. 3, illumination lens 100 includes incidence surface 110 on which light emitted from light emitting element 200 is incident, emission surface 120 from which the light incident thereon from incidence surface 110 is emitted toward a square (n-sided polygon: n=4)-shaped surface to be irradiated, flange 130 that is provided in an outer peripheral part, and cylindrical foot 140 that is provided on the bottom surface side of flange 130.

Illumination lens 100 is formed by integral molding. A material of illumination lens 100 is not particularly limited as long as it is a material capable of transmitting light having a desired wavelength. For example, the material of illumination lens 100 is a light-transmissive resin such as polymethylmethacrylate (PMMA), polycarbonate (PC), or epoxy resin (EP), or is glass.

Illumination lens 100 is attached onto a substrate (not shown) to which light emitting element 200 is fixed, so that central axis CA is consistent with an optical axis of light emitting element 200 (see FIG. 3A). Flange 130 and foot 140 are provided in order to fix illumination lens 100 to the substrate. Illumination lens 100 and light emitting element 200 constitute light emitting apparatus 300. For example, light emitting element 200 is a light-emitting diode (LED) such as a white light-emitting diode.

Incidence surface 110 of illumination lens 100 is an inner surface of concave part 111 that is formed on the bottom (located on the opposite side to emission surface 120) of illumination lens 100. Concave part 111 has a substantially quadrangular pyramid shape. That is, incidence surface 110 is formed at a position corresponding to light emitting element 200 at the bottom of illumination lens 100, and is a concave quadrangular pyramid surface (side surface of quadrangular pyramid) with respect to the bottom of illumination lens 100. The shape of an opening part of concave part 111 (the shape of bottom surface of quadrangular pyramid) is substantially similar to the shape (square) of a surface to be irradiated. In addition, the shape of a cross-section of incidence surface 110 at an arbitrary position in a direction (hereinafter, referred to as "horizontal direction") which is perpendicular to central axis CA (optical axis of light emitting element) of illumination lens 100 is also substantially similar to the shape (square) of the surface to be irradiated. Here, the "arbitrary position" is a position that crosses each flat surface 112 (flat surface that is not R surface 113 to be described later) of concave part 111. In addition, as described later, the quadrangular pyramid is R-chamfered, and an R part is formed in a corner part of the cross-section of incidence surface 110 in the horizontal direction. Therefore, the shape of the cross-section of incidence surface 110 in the horizontal direction is "substantially" similar to the shape (square) of the surface to be irradiated.

A boundary (ridge line and apex) between flat surface 112 of concave part 111 is constituted by R surface 113 (see FIG. 2B). Therefore, the shape of a cross-section of concave part 111 in the horizontal direction in the vicinity of an apex part has a small straight-line part, and thus is close to a circular shape. When the boundary between flat surfaces 112 of incidence surface 110 is not R surface 113, it is not possible to direct light onto a central part and a diagonal line of the surface to be irradiated, and thus illuminance unevenness may occur. A radius of R surface 113 is not particularly limited as long as it can prevent the illuminance unevenness of the surface to be irradiated from occurring. For example, the radius of R surface 113 is set as follows.

Figure 6:
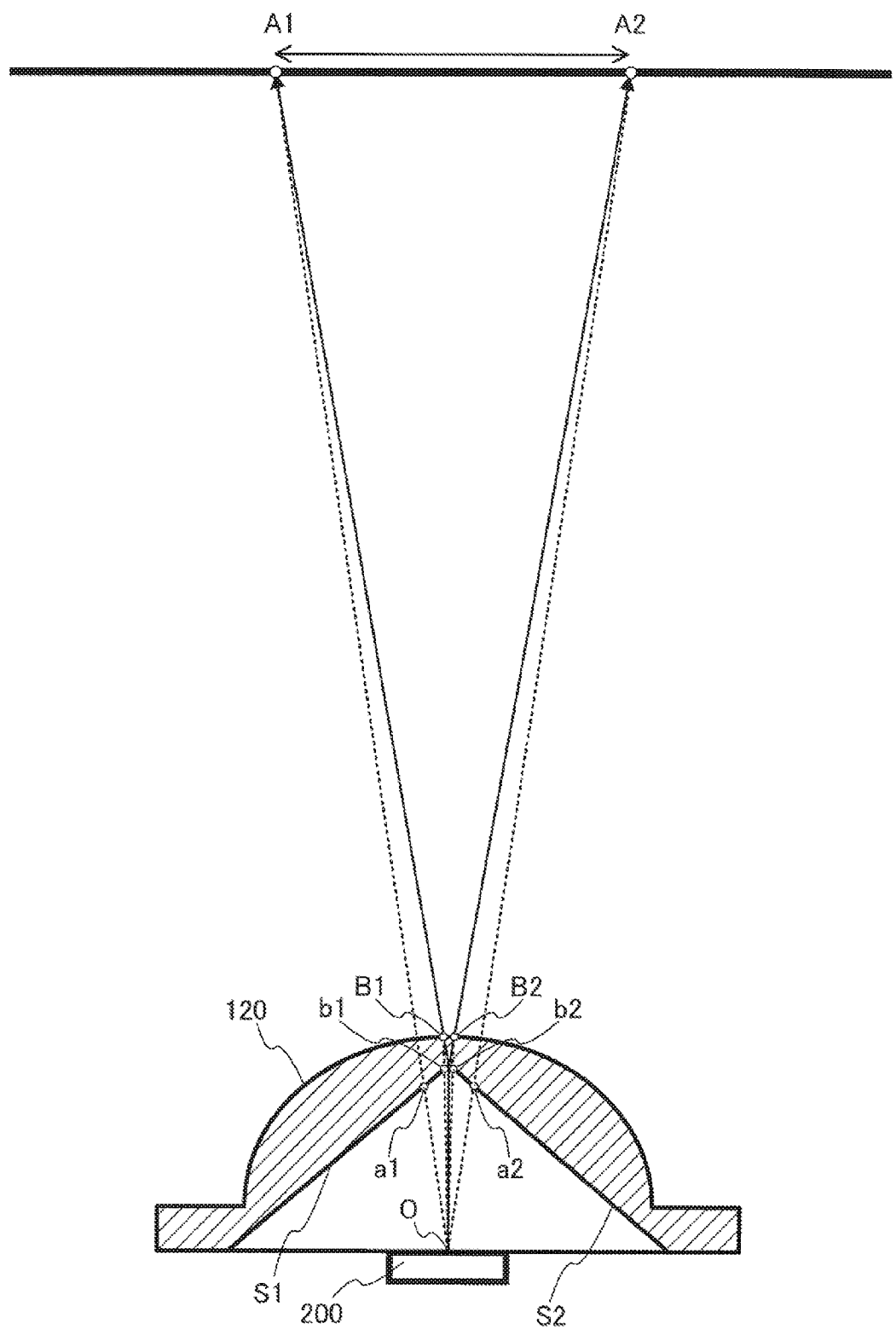
FIG. 6 is a cross-sectional view of an illumination lens having an incidence surface that does not include an R surface.

As illustrated in FIG. 6, it is assumed that light is incident on an incidence surface that does not include an R surface. When light (solid line) which is emitted in an optical axis direction from light-emitting point O (point on the optical axis) of a light emitting element 200 is incident on incidence surface S1 shown on the left side of FIG. 6, the light reaches point A1 on a surface to be irradiated via point B1 on an emission surface 120. On the other hand, when the light (solid line) which is emitted in the optical axis direction from light-emitting point O of the light emitting element 200 is incident on incidence surface S2 shown on the right side of FIG. 6, the light reaches point A2 on the surface to be irradiated via point B2 on the emission surface 120. At this time, a region between point A1 and point A2 on the surface to be irradiated becomes a dark part due to the lack of the amount of light. An R surface is formed so that the region does not become a dark part.

When an intersection point between line segment OB1 and incidence surface S1 is set as b1 and an intersection point between line segment OB2 and incidence surface S2 is set as b2, a radius of an inscribed circle using point b1 and point b2 as contact points serves as a minimum radius of the R surface. The R surface is formed in this manner, and thus light also reaches a region between point B1 and point B2 of the emission surface, which allows the region between point A1 and point A2 of the surface to be irradiated to be irradiated with light.

The radius of the R surface is set to be equal to or greater than the above-mentioned minimum radius, and thus it is possible to suppress the generation of a dark part in the surface to be irradiated. In order to more reliably suppress the generation of a dark part, it is preferable to set a radius of an inscribed circle, which uses point a1 and point a2 illustrated in FIG. 6 as contact points, to the radius of the R surface. Here, point a1 is an intersection point between line segment OA1 and incidence surface S1, and point a2 is an intersection point between line segment OA2 and incidence surface S2. Meanwhile, when the shape of incidence surface 110 becomes closer to a spherical surface by increasing the size of the region of the R surface more than necessary, it is not possible to distribute emitted light in the vicinity of the optical axis in a peripheral direction of the surface to be irradiated, and thus a dark part may be generated in the central part of the surface to be irradiated.

Herein, the radius of the R surface in the apex part of the pyramidal surface has been described, but the same is true of a radius of a ridge line part of the pyramidal surface.

Incidence surface 110 will be described again. In R surface 113 of the ridge line part of the pyramidal surface, a region (region shown as "E" in FIG. 4) in the vicinity of the apex is roughened. The region is roughened in this manner, and thus it is possible to prevent cruciform (X-shaped) illuminance unevenness from occurring in the surface to be irradiated. Meanwhile, when the entirety of R surface 113 is roughened, there is a concern that illuminance in four corners of the surface to be irradiated may be reduced.

As described above, illumination lens 100 is disposed such that central axis CA is consistent with the optical axis of light emitting element 200. At this time, the optical axis of light emitting element 200 passes through the apex of the pyramidal surface (incidence surface 110) (see FIG. 3A).

In illumination lens 100, emission surface 120 is located on the opposite side to incidence surface 110. The shape of the cross-section (cross-section in a direction perpendicular to the optical axis) of emission surface 120 in the horizontal direction is substantially similar to the shape (square) of the surface to be irradiated (see FIG. 5).

Both the shape of the cross-section of incidence surface 110 in the horizontal direction and the shape of the cross-section of emission surface 120 in the horizontal direction are similar to the shape (square) of the surface to be irradiated. At this time, directions of the two substantially squares are consistent with each other. That is, in the cross-section of emission surface 120 illustrated in FIG. 5 in a horizontal direction, straight lines (C1-C2, C2-C3, C3-C4, and C4-C1) connecting corners adjacent to each other in four (n=4) corners C1 to C4 respectively corresponding to four (n=4) corners of the surface to be irradiated are substantially parallel to the corresponding sides of the cross-section (square) of incidence surface 110 in the horizontal direction. In addition, a positional relationship between illumination lens 100 and the surface to be irradiated shows that the sides in the cross-section of incidence surface 110 in the horizontal direction and the straight lines (C1-C2, C2-C3, C3-C4, and C4-C1) in the cross-section of emission surface 120 in the horizontal direction are disposed so as to be substantially parallel to sides of the surface to be irradiated which correspond to the sides in the cross-section of the incidence surface.

Meanwhile, in the cross-section of emission surface 120 illustrated in FIG. 5 in a horizontal direction, the cross-section of emission surface 120 has the same shape as (overlaps with) a quadrangle defined by the straight lines (C1-C2, C2-C3, C3-C4, and C4-C1) connecting the corners adjacent to each other in four (n=4) corners C1 to C4 corresponding to the four corners (n=4) of the surface to be irradiated.

As illustrated in FIG. 3A and FIG. 3B, four (n=4) curved surfaces constituting emission surface 120 are curved surfaces that are convex with respect to flat surface 112 (corresponding flat surface 112) that is the closest thereto, in four (n=4) flat surfaces 112 constituting incidence surface 110. In addition, the four (n=4) curved surfaces constituting emission surface 120 do not have a curvature in the horizontal direction (see FIG. 5). That is, each of the four curved surfaces constituting emission surface 120 is a straight line in the cross-section of emission surface 120 in a horizontal direction. In this case, a configuration is provided in which four cylindrical lenses are disposed in the vicinity of light emitting element 200. In this manner, it is possible to condense light toward a rim part of the surface to be irradiated. In addition, unlike incidence surface 110, a boundary between the four (n=4) curved surfaces constituting emission surface 120 does not have an R surface (see FIG. 1A). However, a minimum R surface that is required when processing a mold may be formed.

Flange 130 and foot 140 support illumination lens 100. As described above, flange 130 and foot 140 are provided in order to fix illumination lens 100 to the substrate. Therefore, flange 130 and foot 140 having a shape capable of accomplishing the object are not particularly limited to the shape shown in this embodiment, as long as they have a shape that does not exert adverse influences on optical properties.

It is possible to reduce an amount of light that is directed in the optical axis direction of light emitting element 200 and to increase an amount of light that is directed to the four corners of the surface to be irradiated, by using illumination lens 100 according to Embodiment 1. As a result, it is possible to uniformly and effectively irradiate the square-shaped surface to be irradiated with light from the light emitting element, by using illumination lens 100 according to Embodiment 1.

Figure 7A:
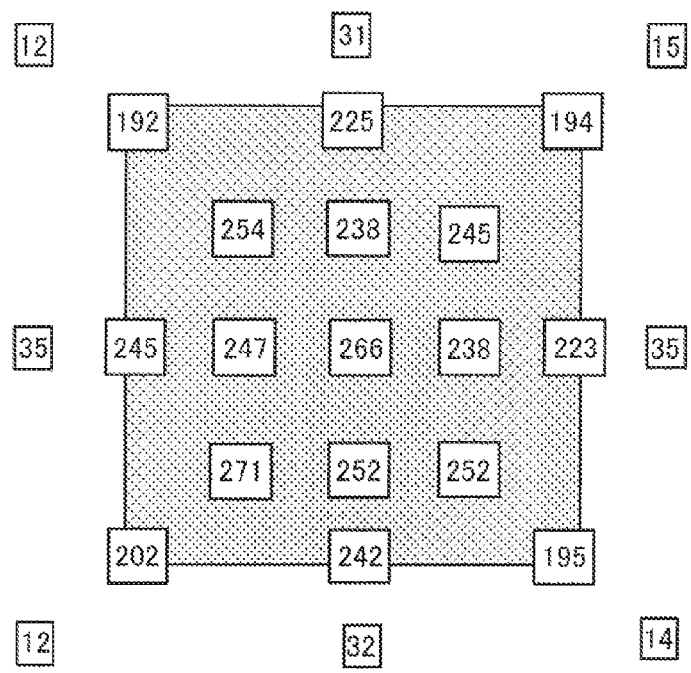
FIG. 7A is a diagram illustrating illuminance distribution when the illumination lens according to Embodiment 1 is used.

FIG. 7A is a diagram illustrating illuminance distribution when a square-shaped surface to be irradiated is irradiated by using light emitting apparatus 300 including illumination lens 100 and light emitting element 200 according to Embodiment 1. In this experiment, an interval between light emitting element 200 and the surface to be irradiated is set to 250 mm. In addition, a size of the surface to be irradiated is set to 500 mm×500 mm.

The size of each part of illumination lens 100 (made of PMMA) that is used in this experiment is as follows.

The length of one side of incidence surface 110 (substantially square) when seen in a plan view: 8.2 mm The length of one side of emission surface 120 (square) when seen in a plan view: 7.67 mm The height from the opening part of concave part 111 to the apex of emission surface 120: 4 mm The radius of R surface 113: 2 mm In FIG. 7A, the square-shaped surface to be irradiated (500 mm×500 mm) is colored. Each numerical value is illuminance (unit: lx) in the relevant part. As illustrated in FIG. 7A, when illumination lens 100 according to Embodiment 1 is used, it is possible to uniformly irradiate the inside of the square-shaped surface to be irradiated with light (192 lx to 266 lx). On the other hand, parts other than the surface to be irradiated are barely irradiated with light (12× to 35×). Thus, it is seen that the square-shaped surface to be irradiated is uniformly and effectively irradiated.

Figure 7B:
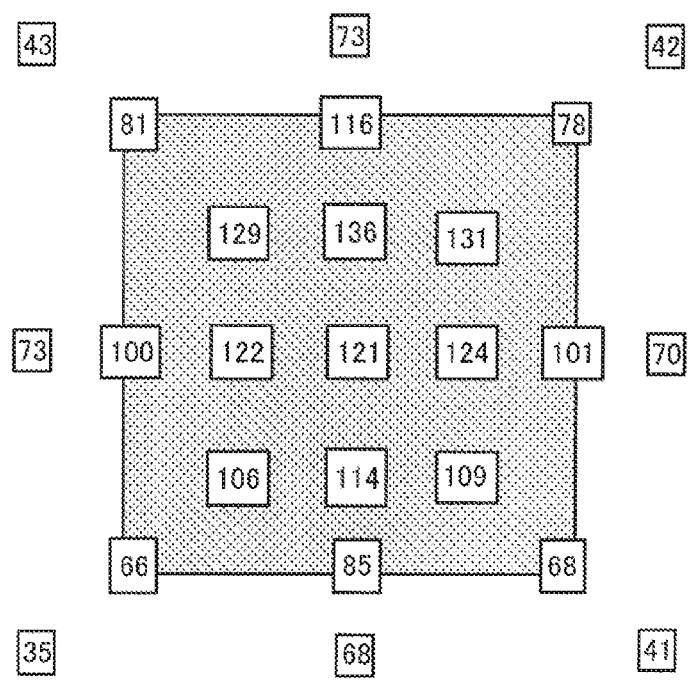
FIG. 7B is a diagram illustrating illuminance distribution when an illumination lens of the related art is used.

FIG. 7B is a diagram illustrating illuminance distribution when a square-shaped surface to be irradiated is irradiated, by using a light emitting apparatus including an illumination lens of the related art and a light emitting element. In this experiment, illumination lens 10 (made of PMMA) illustrated in FIG. 8 is used as the illumination lens of the related art.

Figure 8A:
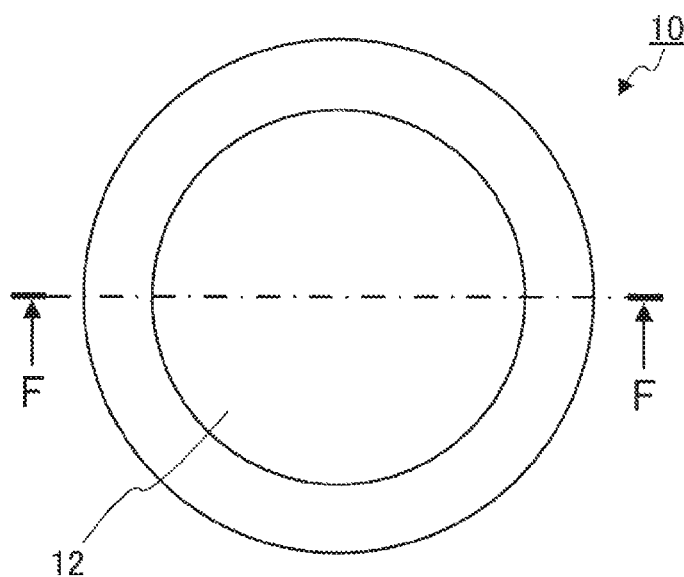
FIG. 8A is a plan view of the illumination lens of the related art.
Figure 8B:
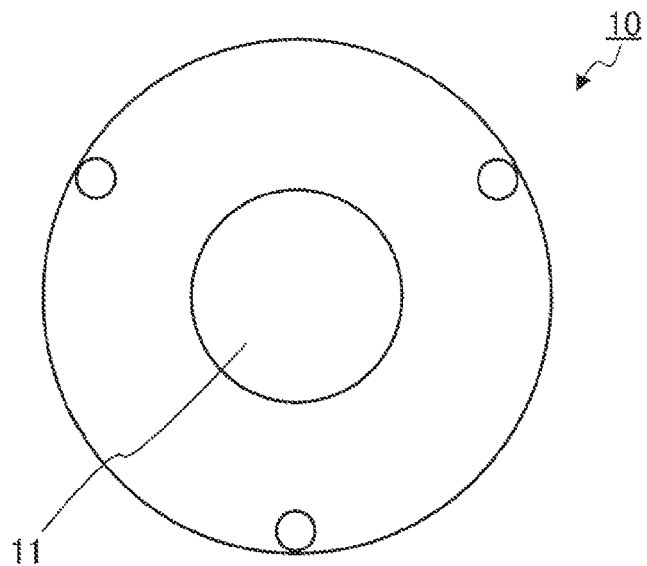
FIG. 8B is a bottom view of the illumination lens of the related art.
Figure 8C:
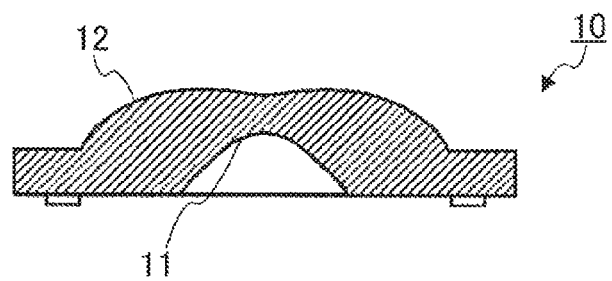
FIG. 8C is a cross-sectional view taken along line F-F illustrated in FIG. 8A.

FIG. 8A is a plan view of the illumination lens of the related art, FIG. 8B is a bottom view of the illumination lens of the related art, and FIG. 8C is a cross-sectional view taken along line F-F illustrated in FIG. 8A. A diameter of incidence surface 11 (circle) when seen in a plan view is substantially the same as a diameter of an inscribed circle of incidence surface 110 (substantially square) when seen in a plan view of illumination lens 100 according to the embodiment. In addition, a diameter of emission surface 12 (circle) when seen in a plan view is approximately the same as a diameter of a circumscribed circle of emission surface 120 (square), when seen in a plan view, of illumination lens 100 according to the embodiment.

As illustrated in FIG. 7B, when illumination lens 10 of the related art is used, the illuminance of each of four corners of the square-shaped surface to be irradiated is lower than that of the central part thereof, and thus illuminance unevenness occurs. In addition, since parts other than the surface to be irradiated are irradiated with light (35× to 73×), the illuminance of the inside of the surface to be irradiated was lower than that of illumination lens 100 according to Embodiment 1 (66 lx to 136 lx).

In this manner, it is possible to uniformly and effectively irradiate the square-shaped surface to be irradiated with light from light emitting element 200, as compared with illumination lens 10 of the related art, by using illumination lens 100 according to Embodiment 1.

Meanwhile, the inventors have also performed the same experiment on illumination lenses having shapes illustrated in FIG. 9 to FIG. 13.

Figure 9A:
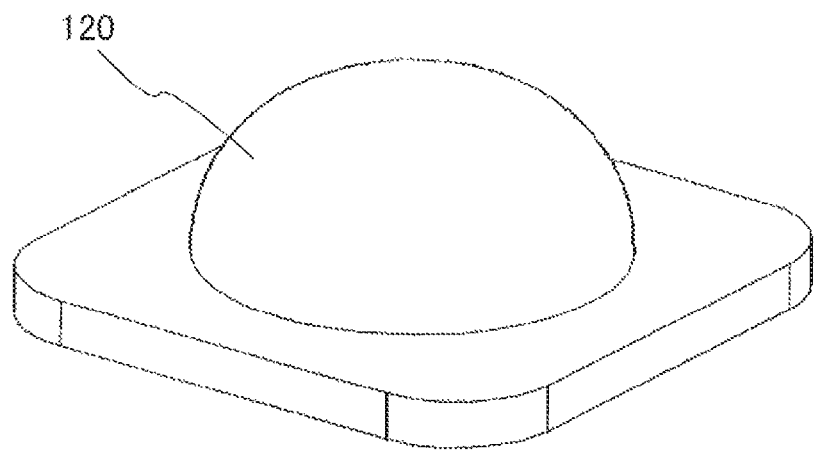
FIG. 9A is a top perspective view of an illumination lens for comparison.
Figure 9B:
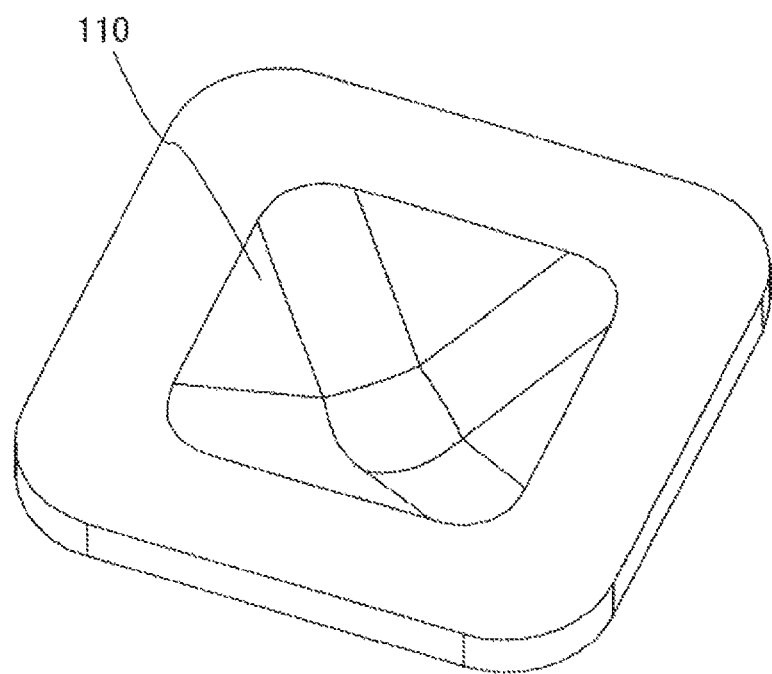
FIG. 9B is a bottom perspective view of the illumination lens for comparison.

The illumination lens illustrated in FIG. 9 is different from illumination lens 100 according to Embodiment 1 in that a horizontal section of emission surface 120 has a circular shape. FIG. 9A is a top perspective view, and FIG. 9B is a bottom perspective view. When the illumination lens illustrated in FIG. 9 was used, four corners of a square-shaped surface to be irradiated were darkened.

Figure 10A:
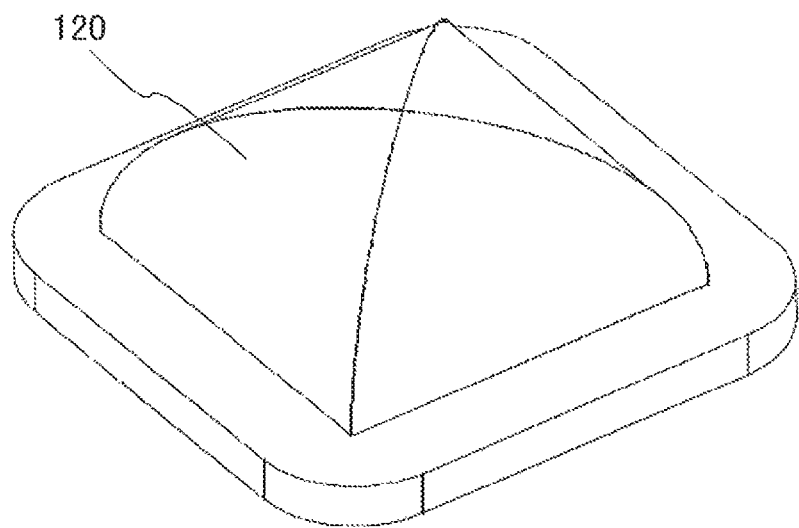
FIG. 10A is a top perspective view of an illumination lens for comparison.
Figure 10B:
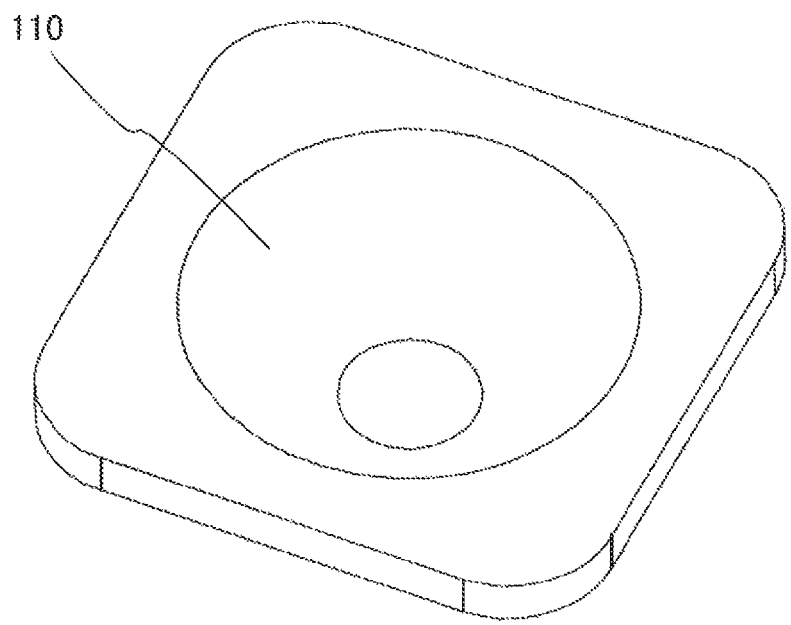
FIG. 10B is a bottom perspective view of the illumination lens for comparison.

The illumination lens illustrated in FIG. 10 is different from illumination lens 100 according to Embodiment 1 in that incidence surface 110 is a circular conical surface (the vicinity of the apex is constituted by an R surface). FIG. 10A is a top perspective view, and FIG. 10B is a bottom perspective view. When the illumination lens illustrated in FIG. 10 was used, a central region of a square-shaped surface to be irradiated was darkened.

Figure 11A:
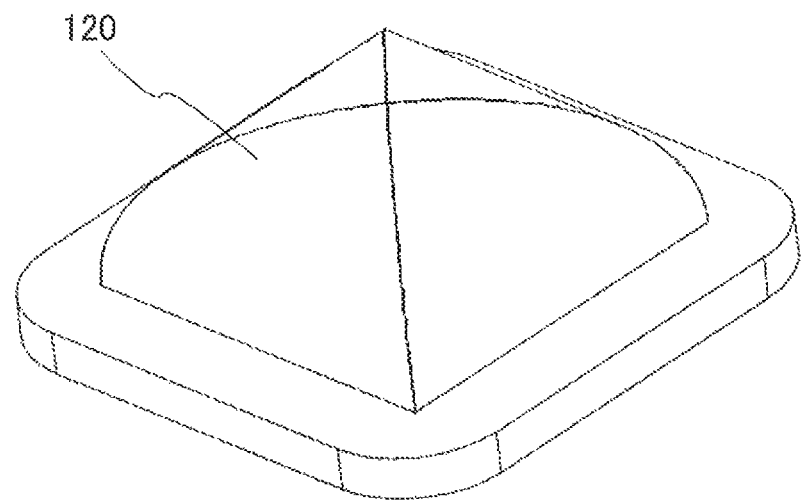
FIG. 11A is a top perspective view of an illumination lens for comparison.
Figure 11B:
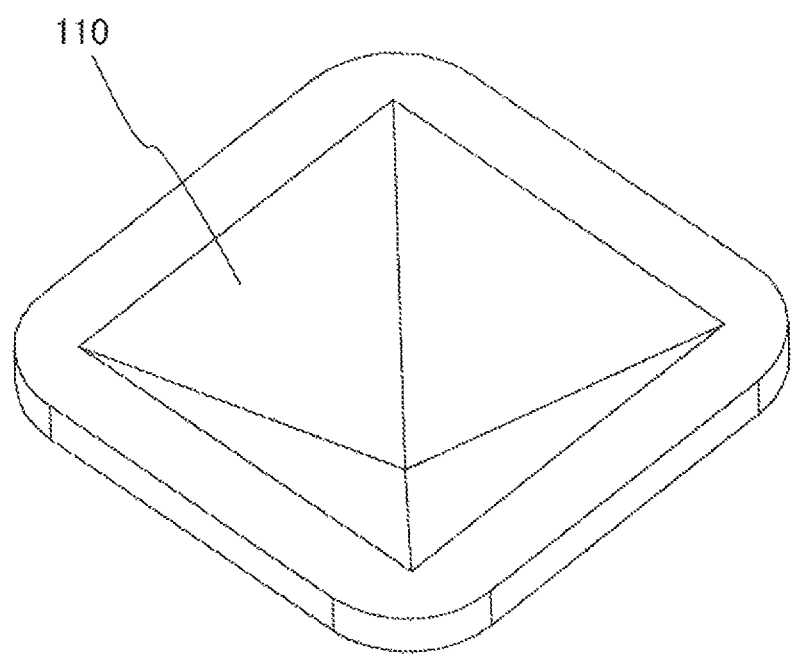
FIG. 11B is a bottom perspective view of the illumination lens for comparison.

The illumination lens illustrated in FIG. 11 is different from illumination lens 100 according to Embodiment 1 in that an R surface is not present (ridge line is present) in a boundary between surfaces of incidence surface 110. FIG. 11A is a top perspective view, and FIG. 11B is a bottom perspective view. When the illumination lens illustrated in FIG. 11 was used, a central region of a square-shaped surface to be irradiated and a region in the vicinity of a diagonal line were darkened.

Figure 12A:
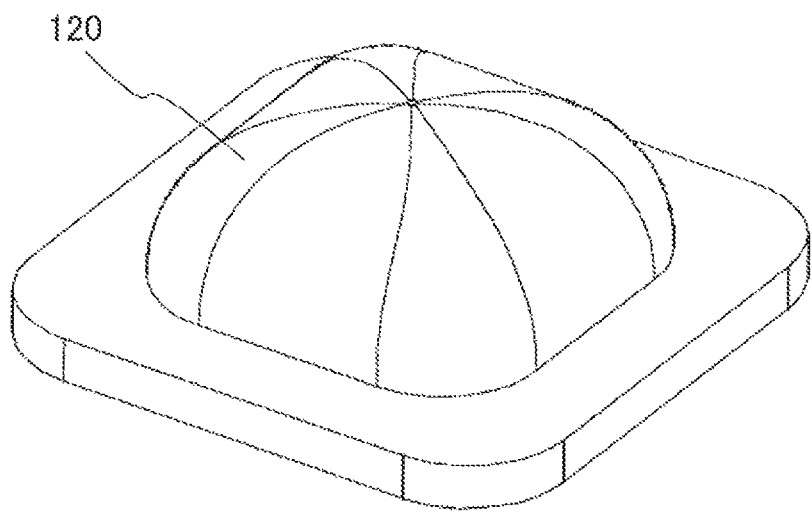
FIG. 12A is a top perspective view of an illumination lens for comparison.
Figure 12B:
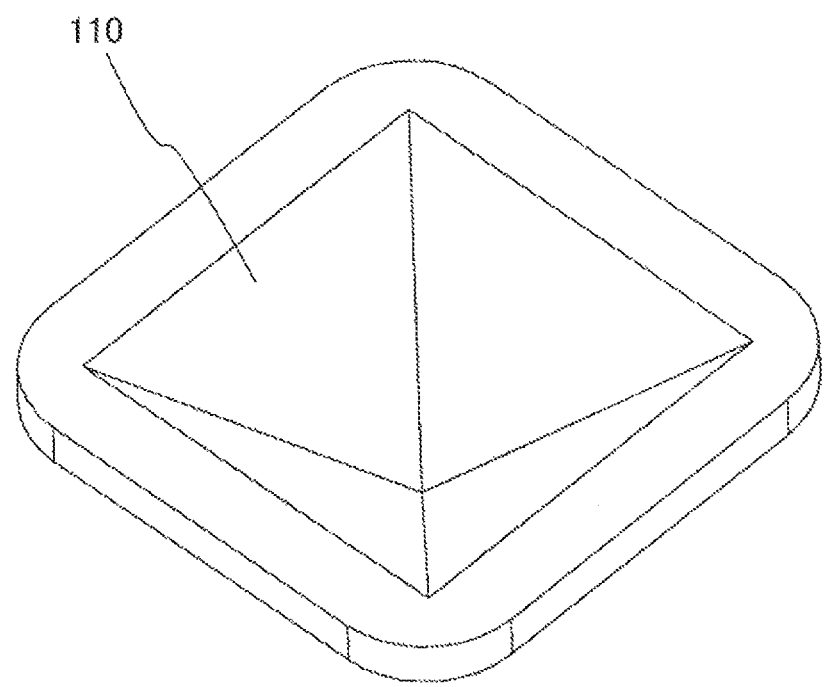
FIG. 12B is a bottom perspective view of the illumination lens for comparison.

The illumination lens illustrated in FIG. 12 is different from illumination lens 100 according to Embodiment 1 in that an R surface is present (ridge line is not present) in a boundary between surfaces of emission surface 120 and that an R surface is not present (ridge line is present) in a boundary between surfaces of incidence surface 110. FIG. 12A is a top perspective view, and FIG. 12B is a bottom perspective view. Even when the illumination lens illustrated in FIG. 12 was used, a central region of a square-shaped surface to be irradiated and a region in the vicinity of a diagonal line were darkened.

Figure 13A:
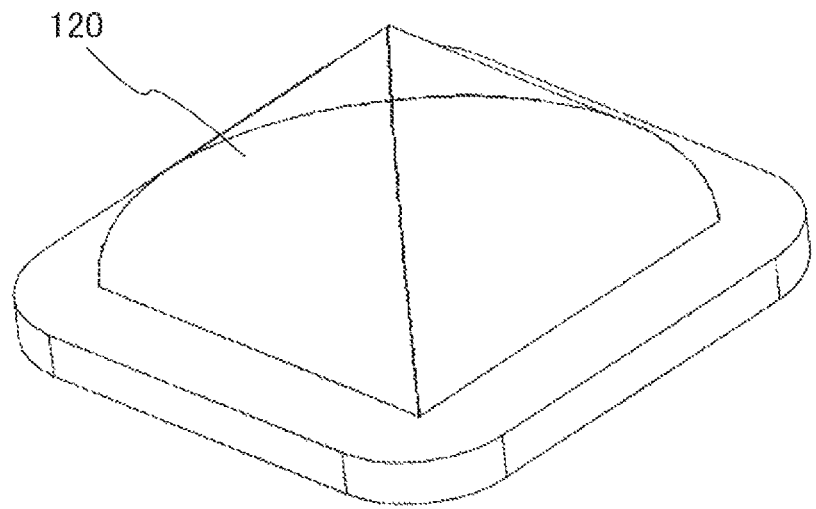
FIG. 13A is a top perspective view of an illumination lens for comparison.
Figure 13B:
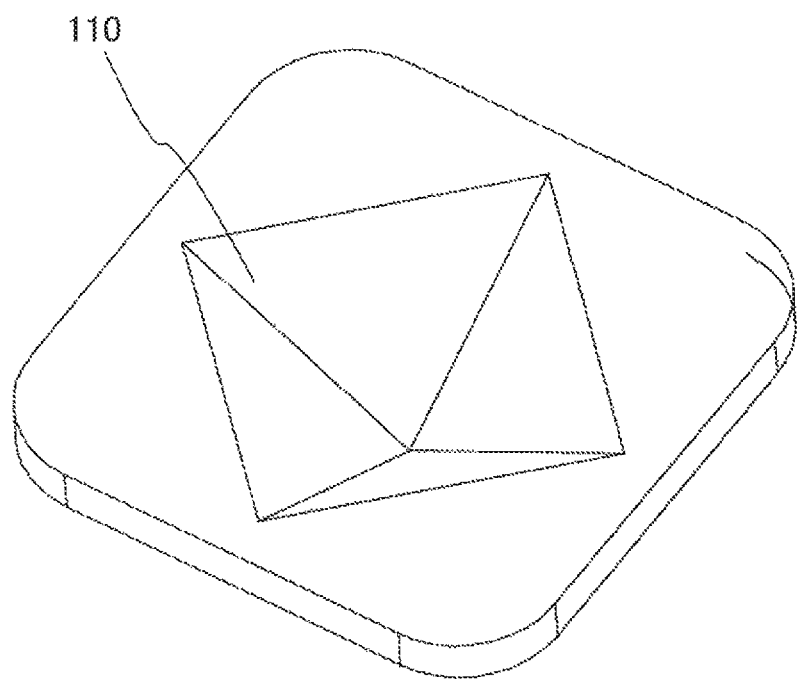
FIG. 13B is a bottom perspective view of the illumination lens for comparison.

The illumination lens illustrated in FIG. 13 is different from illumination lens 100 according to Embodiment 1 in that a square formed by an outer rim of incidence surface 110 and a square formed by an outer rim of the emission surface deviate by 45 degrees when illumination lens 100 is seen in a plan view, and that an R surface is not present (ridge line is present) in a boundary between surfaces of incidence surface 110. FIG. 13A is a top perspective view, and FIG. 13B is a bottom perspective view. When the illumination lens illustrated in FIG. 13 was used, light was condensed on a central region of a square-shaped surface to be irradiated and a region in the vicinity of a diagonal line.

The above experimental results show that it is important to satisfy conditions 1) to 3) below in order to uniformly and effectively irradiate the square-shaped surface to be irradiated.

1) Incidence surface 110 is a pyramidal surface in which a boundary between surfaces thereof is an R surface.

2) The shape of a horizontal section of incidence surface 110 is substantially similar to the shape of the surface to be irradiated.

3) Four corners of a horizontal section of emission surface 120 correspond to four corners of the horizontal section of incidence surface 110. That is, in the horizontal section of emission surface 120, straight lines connecting corners adjacent to each other in the four corners corresponding to four corners of the surface to be irradiated are substantially parallel to corresponding sides of the horizontal section of incidence surface 110.

[Configuration of Illumination Apparatus]

Next, an illumination apparatus including light emitting apparatus 300 according to Embodiment 1 will be described.

Figure 14:
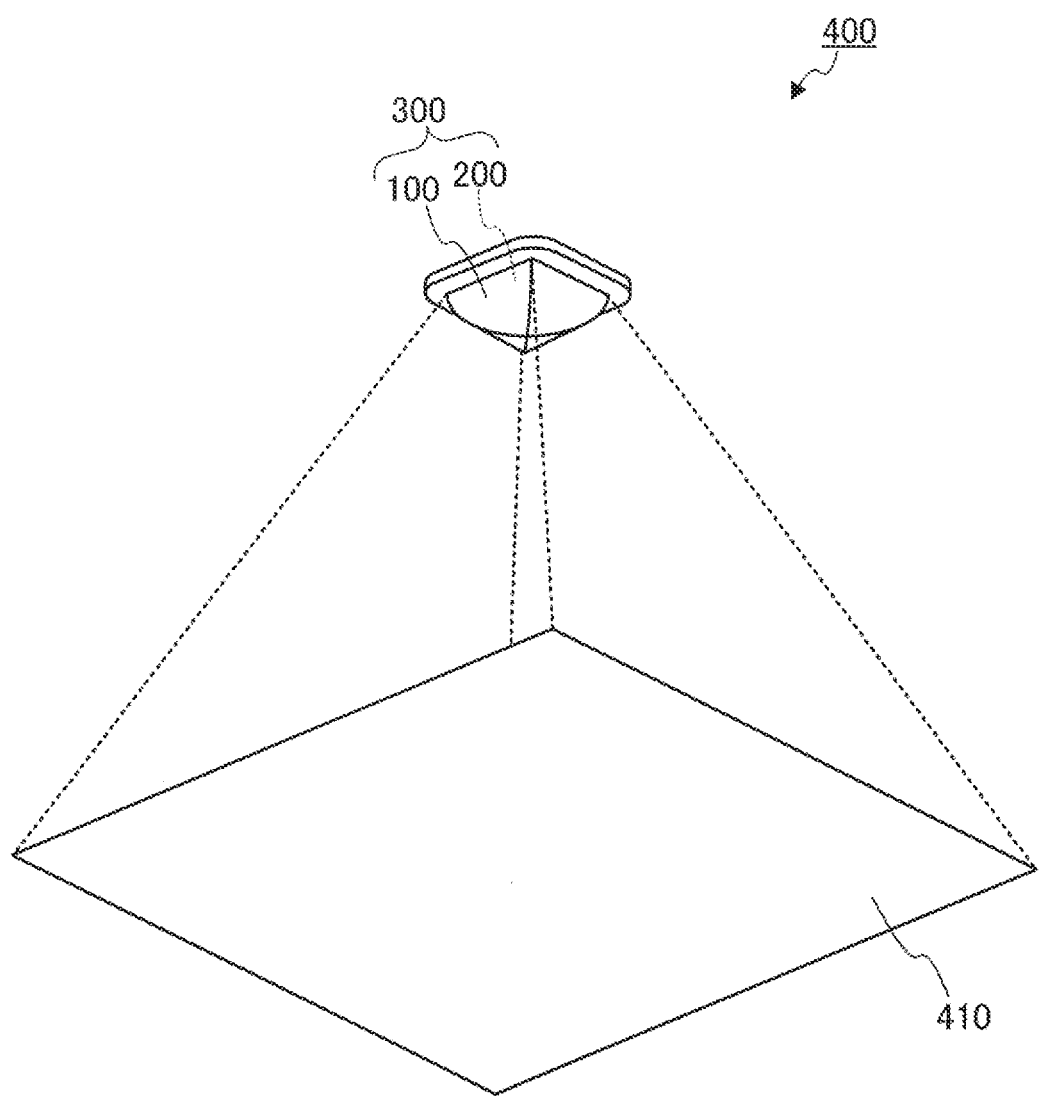
FIG. 14 is a perspective view of an illumination apparatus according to Embodiment 1.

FIG. 14 is a perspective view of illumination apparatus 400 according to Embodiment 1. As illustrated in FIG. 14, illumination apparatus 400 includes light emitting apparatus 300 and square surface 410 to be irradiated. As described above, light emitting apparatus 300 includes illumination lens 100 and light emitting element 200.

Surface 410 to be irradiated is a square (n-sided polygon: n=4)-shaped flat surface. Light emitting apparatus 300 is disposed in such a manner that surface 410 to be irradiated is perpendicular to central axis CA of illumination lens 100 and the optical axis of light emitting element 200 (see FIG. 3A). At this time, central axis CA of illumination lens 100 and the optical axis of light emitting element 200 pass through a central part of surface 410 to be irradiated.

As described above, both the horizontal section of incidence surface 110 and the horizontal section of emission surface 120 of illumination lens 100 have a substantially square shape. Here, light emitting apparatus 300 is disposed in such a manner that sides of these two squares and sides of surface 410 to be irradiated are parallel to each other.

Illumination apparatus 400 is used by irradiating surface 410 to be irradiated with light that is emitted from light emitting apparatus 300. Light emitting apparatus 300 according to Embodiment 1 uniformly irradiates square surface 410 to be irradiated and does not nearly irradiate parts other than surface 410 to be irradiated. Therefore, illumination apparatus 400 can uniformly and effectively illuminate square surface 410 to be irradiated.

Figure 15A:
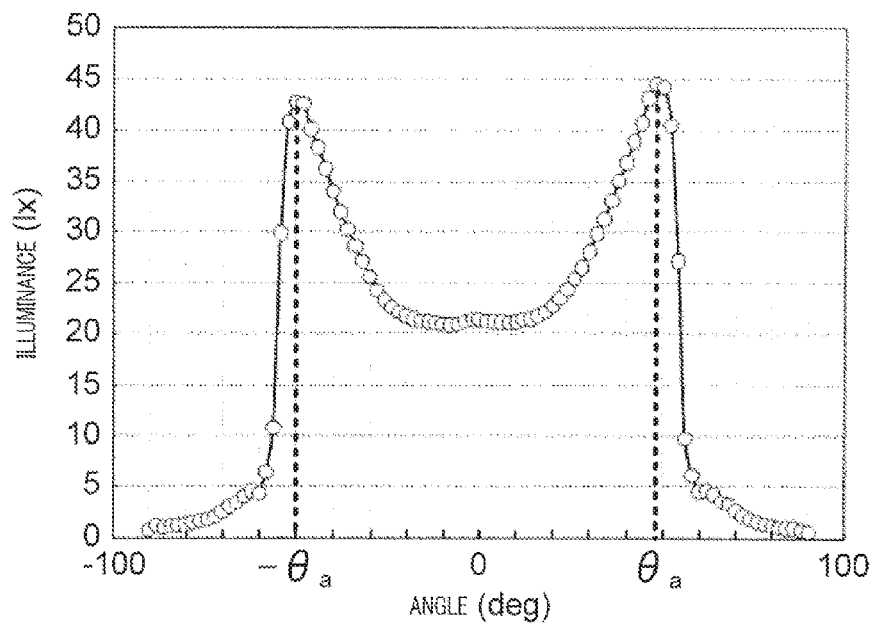
FIG. 15A is a graph illustrating light distribution of a light emitting apparatus according to Embodiment 1.
Figure 15B:
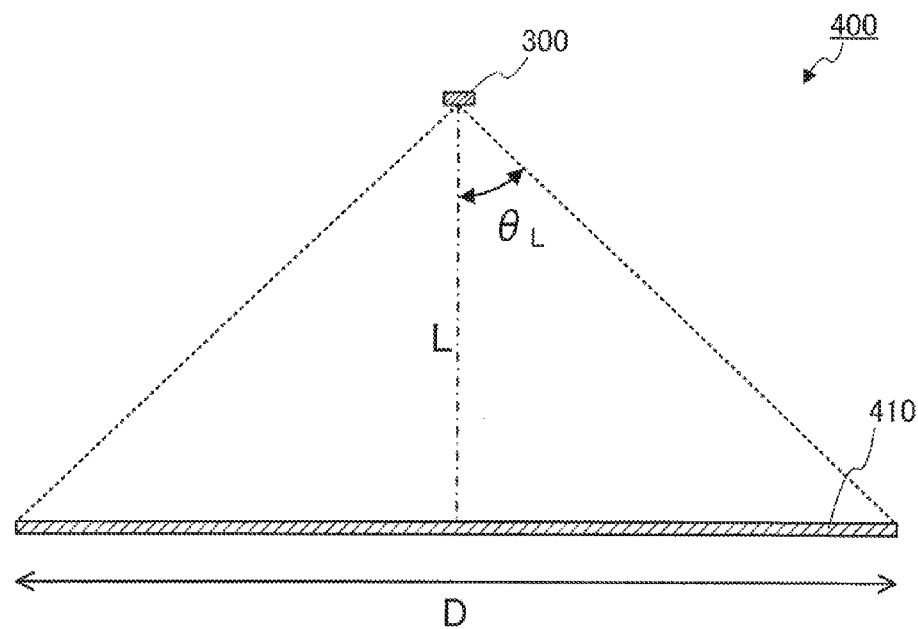
FIG. 15B is a side view of the illumination apparatus according to Embodiment 1.
Figure 16A:
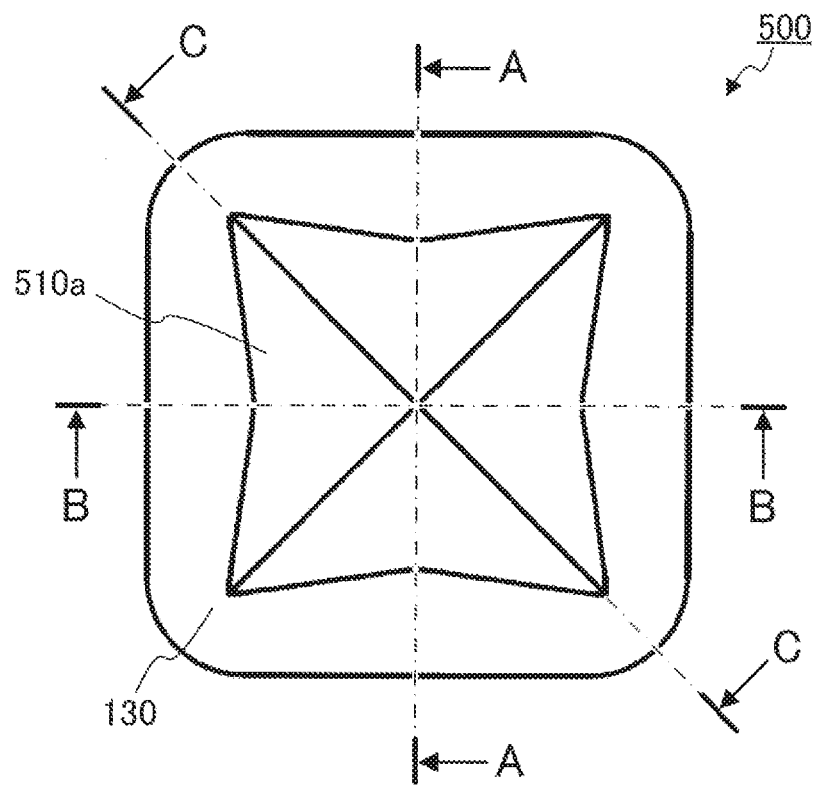
FIG. 16A is a plan view of an illumination lens according to Embodiment 2.
Figure 16B:
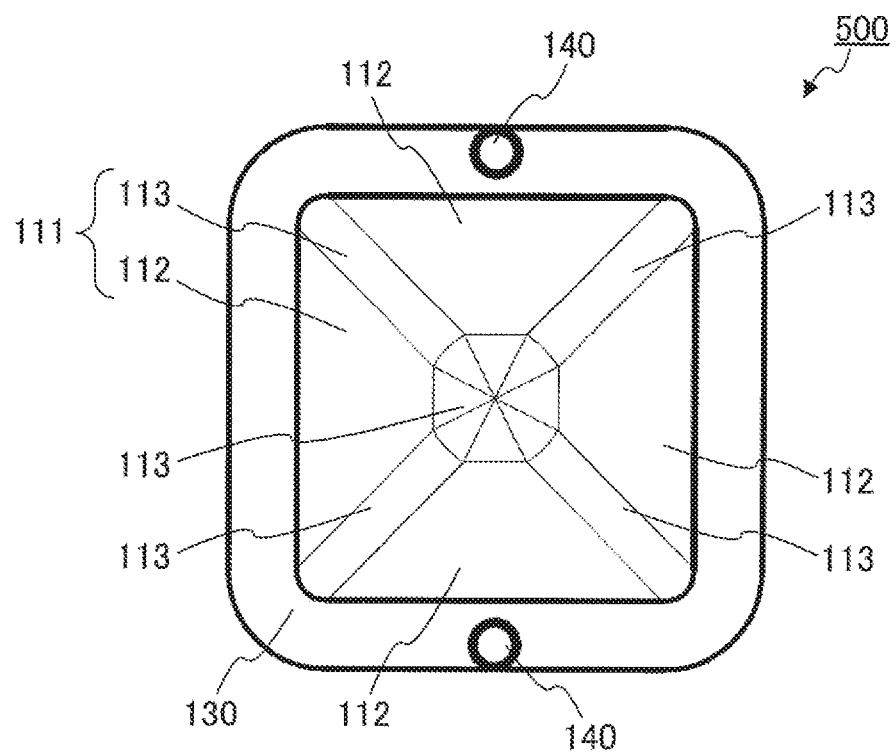
FIG. 16B is a bottom view of the illumination lens according to Embodiment 2.

FIG. 15A is a graph illustrating the light distribution of light emitting apparatus 300 according to Embodiment 1 (measured angle 0 degrees). In addition, FIG. 15B is a side view of illumination apparatus 400 according to Embodiment 1.

As illustrated in FIG. ISA, light emitting apparatus 300 according to Embodiment 1 has the highest illuminance at a predetermined angle $\pm\theta_a$ (in the graph of FIG. 15A, approximately ±50 degrees). The value of $\theta_a$ varies according to an angle of incidence surface 110 with respect to a substrate surface of light emitting element 200 and a curvature of each surface of emission surface 120. As illustrated in FIG. 15B, when an angle of a line, which connects light emitting apparatus 300 and an end part of surface 410 to be irradiated, with respect to the central axis (consistent with central axis CA of illumination lens 100) of light emitting apparatus 300 is set to $\theta_L$, it is preferable to dispose light emitting apparatus 300 so that the relation of $\theta_L > \theta_a$ is established, in order to effectively irradiate surface 410 to be irradiated.

[Effects]

Illumination lens 100, light emitting apparatus 300, and illumination apparatus 400 according to Embodiment 1 can uniformly and effectively irradiate square surface 410 to be irradiated with light that is emitted from light emitting element 200.

(Embodiment 2)

[Configuration of Illumination Lens and Light Emitting Apparatus]

Figure 17:
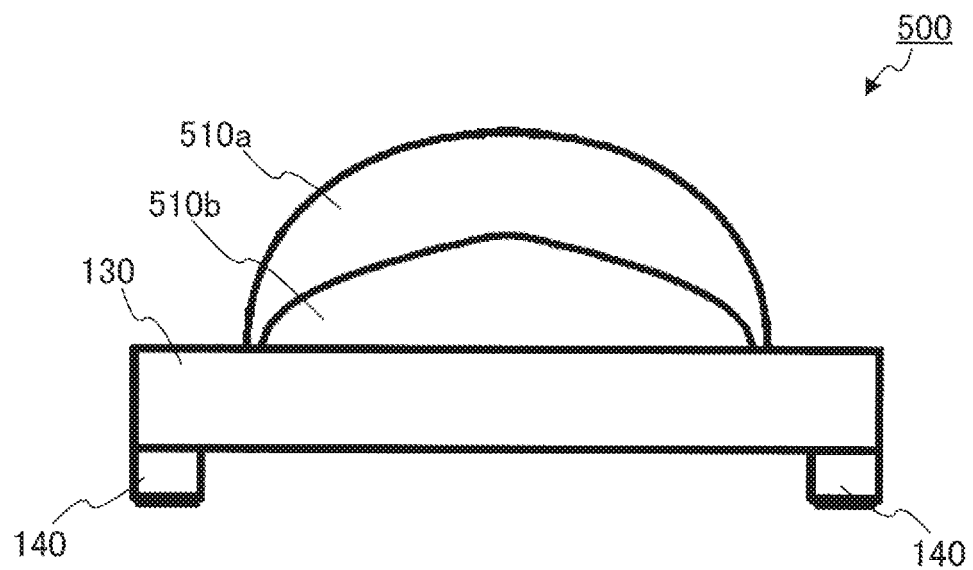
FIG. 17 is a side view of the illumination lens according to Embodiment 2.

FIG. 16 to FIG. 19 are diagrams illustrating a configuration of illumination lens 500 according to Embodiment 2. FIG. 16A is a plan view of illumination lens 500, and FIG. 16B is a bottom view of illumination lens 500. FIG. 17 is a side view of illumination lens 500. FIG. 18A is a cross-sectional view taken along line A-A illustrated in FIG. 16A, FIG. 18B is a cross-sectional view taken along line B-B illustrated in FIG. 16A, and FIG. 18C is a cross-sectional view taken along line C-C illustrated in FIG. 16A. FIG. 19A is a cross-sectional view taken along line D-D illustrated in FIG. 181, and FIG. 19B is a cross-sectional view taken along line E-E illustrated in FIG. 18B.

Figure 18A:
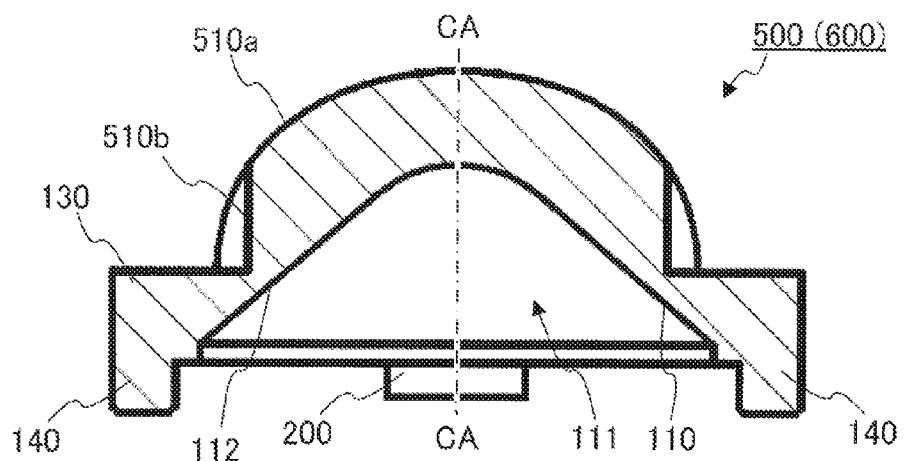
FIG. 18A is a cross-sectional view taken along line A-A illustrated in FIG. 16A.

Meanwhile, FIG. 18A illustrates light emitting element 200 together with illumination lens 500. That is, FIG. 18A is a cross-sectional view of light emitting apparatus 600 according to Embodiment 2.

As illustrated in FIG. 16 to FIG. 19, similarly to illumination lens 100 according to Embodiment 1, illumination lens 500 according to Embodiment 2 includes incidence surface 110, emission surface 510, flange 130, and foot 140. Illumination lens 500 and light emitting apparatus 600 according to Embodiment 2 are substantially the same as illumination lens 100 and light emitting apparatus 300 according to Embodiment 1 (radius of R surface of incidence surface, etc. are slightly different), with regard to components other than the emission surface of the illumination lens. Consequently, the same components as illumination lens 100 and light emitting apparatus 300 according to Embodiment 1 are denoted by the same reference numerals, and a description thereof will not be repeated.

In illumination lens 500, emission surface 510 is located on the opposite side to incidence surface 110. As illustrated in FIG. 17, emission surface 510 is constituted by four surfaces 510a that are located on the upper side (in a travelling direction of light on the optical axis), and four surfaces 510b that are located on the lateral side (on flange 130 side). Four surfaces 510a that are located on the upper side have the same shape as a part of emission surface 120 of illumination lens 100 according to Embodiment 1 (refer to comparison between FIG. 3A and FIG. 18A). On the other hand, four surfaces 510b that are located on the lateral side are surfaces which are substantially parallel to the optical axis (surfaces that are substantially perpendicular to flange 130). The shape of a cross-section of an upper part of emission surface 510 in the horizontal direction is substantially similar to the shape (square) of a surface to be irradiated (see FIG. 19B). On the other hand, the shape of a cross-section of a lower part of emission surface 510 in the horizontal direction is not substantially similar to the shape (square) of the surface to be irradiated (see FIG. 19A).

The positions of four (n=4) corners C1 to C4 in the cross-section of emission surface 510 in a horizontal direction, which correspond to four (n=4) corners of the surface to be irradiated, correspond to four (n=4) corners in the cross-section of incidence surface 110 in the horizontal direction. That is, in the cross-sections of emission surfaces 510 (510a and 510b) illustrated in FIG. 19A and FIG. 19B, straight lines (C1-C2. C2-C3, C3-C4, and C4-C1) connecting corners adjacent to each other in four (n=4) corners C1 to C4 respectively corresponding to the four (n=4) corners of the surface to be irradiated are substantially parallel to the corresponding sides of the cross-section (square) of incidence surface 110 in the horizontal direction. A positional relationship between illumination lens 500 and the surface to be irradiated shows that sides in the cross-section of incidence surface 110 in the horizontal direction and the straight lines (C1-C2, C2-C3, C3-C4, and C4-C1) in the cross-section of emission surface 510 in the horizontal direction are disposed so as to be substantially parallel to the sides of the surface to be irradiated which correspond to the sides in the cross-section of the incidence surface.

Figure 19A:
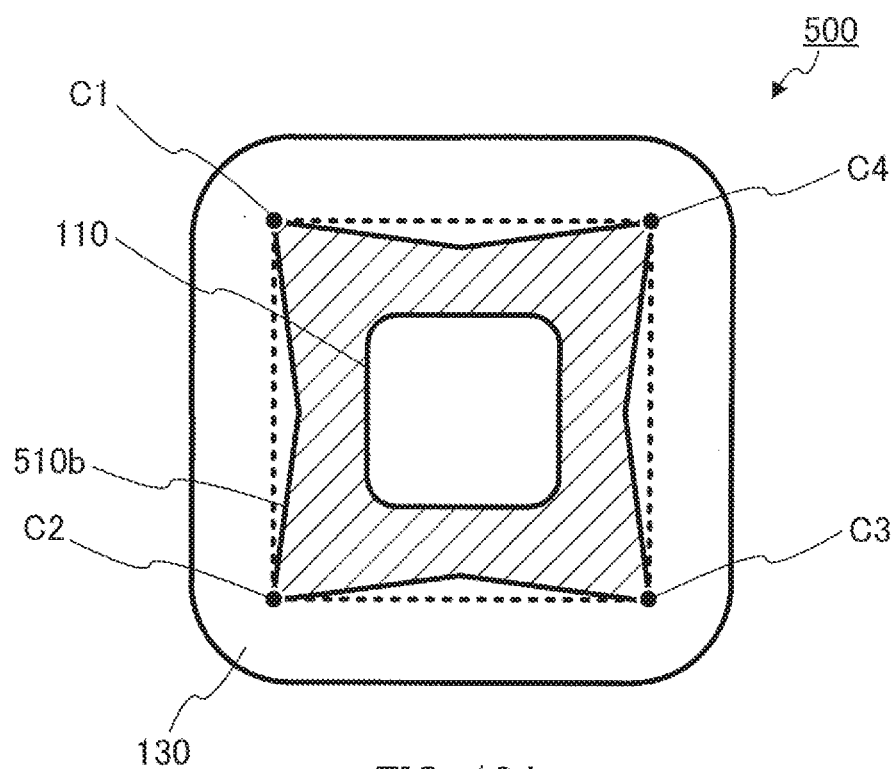
FIG. 19A is a cross-sectional view taken along line D-D illustrated in FIG. 18B.
Figure 19B:
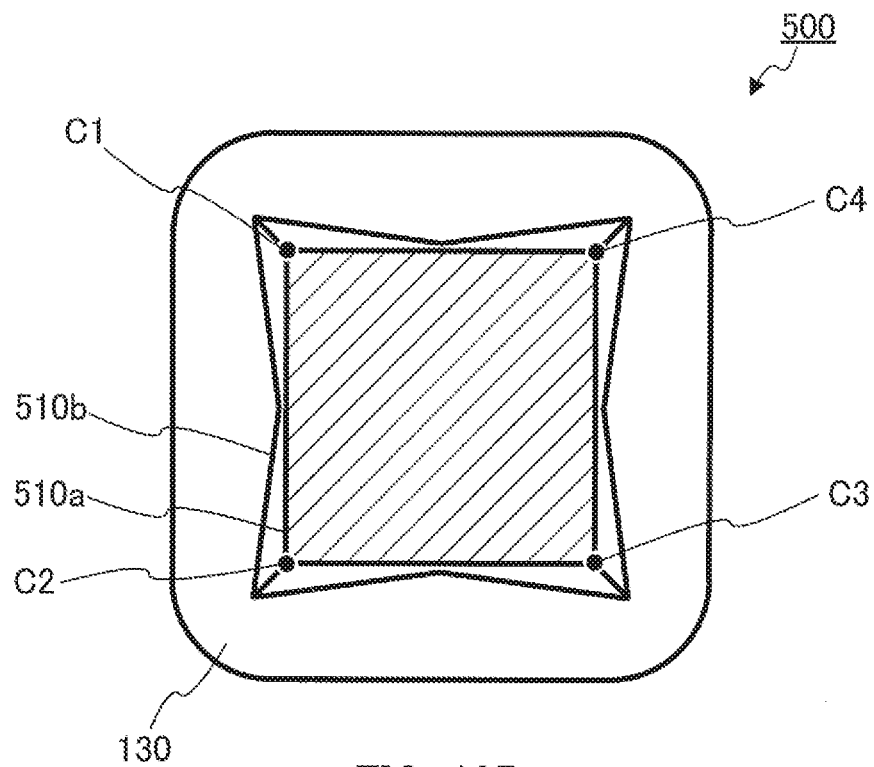
FIG. 19B is a cross-sectional view taken along line E-E illustrated in FIG. 18B.

In the cross-section of the lower part of emission surface 510 illustrated in FIG. 19A in a horizontal direction, the cross-section of emission surface 510 (510b) is included within a quadrangle defined by the straight lines (C1-C2, C2-C3, C3-C4, and C4-C1) connecting corners adjacent to each other in the four (n=4) corners C1 to C4 which correspond to the four (n=4) corners of the surface to be irradiated. On the other hand, in the cross-section of the upper part of emission surface 510 illustrated in FIG. 198 in a horizontal direction, the cross-section of emission surface 510 (510a) is the same as (overlaps with) the quadrangle defined by the straight lines (C1-C2, C2-C3, C3-C4, and C4-C1) connecting the corners adjacent to each other in the four (n=4) corners C1 to C4 which correspond to the four (n=4) corners of the surface to be irradiated.

Figure 18B:
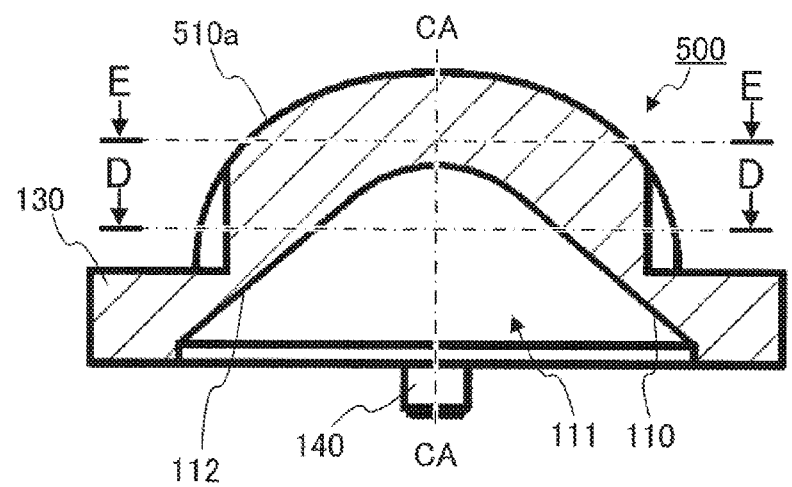
FIG. 18B is a cross-sectional view taken along line B-B illustrated in FIG. 16A.
Figure 18C:
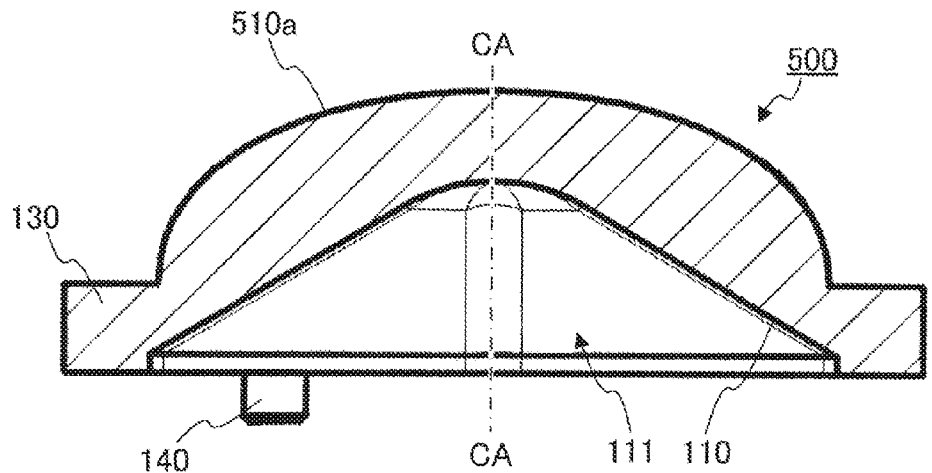
FIG. 18C is a cross-sectional view taken along line C-C illustrated in FIG. 16A.

As illustrated in FIG. 18A and FIG. 18B, in eight surfaces constituting emission surface 510, four curved surfaces 510a coming into contact with the optical axis (central axis CA of illumination lens 500) of the light emitting element and respectively corresponding to four (n=4) flat surfaces 112 constituting incidence surface 110 are curved surfaces having a convex shape with respect to flat surface 112 (corresponding flat surface 112) which is the closest thereto. In addition, these four (n=4) curved surfaces 510a does not have a curvature in the horizontal direction (see FIG. 19B). That is, in the cross-section (cross-section in the horizontal direction) which is perpendicular to central axis CA of illumination lens 500, each of four (n=4) curved surfaces 510a is a straight line.

In this case, a configuration is provided in which four cylindrical lenses are disposed in the vicinity of light emitting element 200. In this manner, it is possible to condense light toward a rim part of the surface to be irradiated. In addition, a boundary between these four (n=4) curved surfaces 510a does not have an R surface (see FIG. 16A).

Similarly to illumination lens 100 according to Embodiment 1, it is possible to uniformly and effectively irradiate the square-shaped surface to be irradiated with light from the light emitting element by using illumination lens 500 according to Embodiment 2.

Figure 20A:
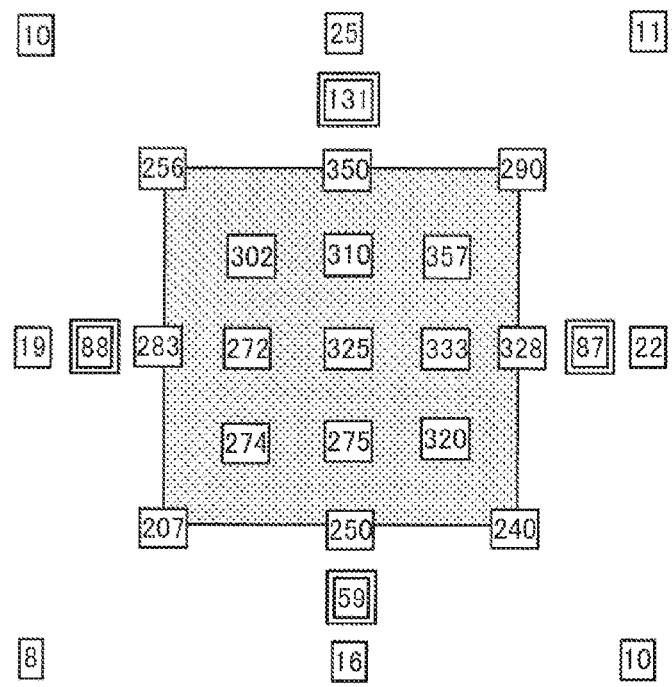
FIG. 20A is a diagram illustrating illuminance distribution when the illumination lens according to Embodiment 2 is used.

FIG. 20A is a diagram illustrating illuminance distribution when a square-shaped surface to be irradiated is illuminated, by using light emitting apparatus 600 including illumination lens 500 and light emitting element 200 according to Embodiment 2. In addition, FIG. 20B is a diagram illustrating illuminance distribution when a square-shaped surface to be irradiated is illuminated, by using light emitting apparatus 300 including illumination lens 100 and light emitting element 200 according to Embodiment 1.

Figure 20B:
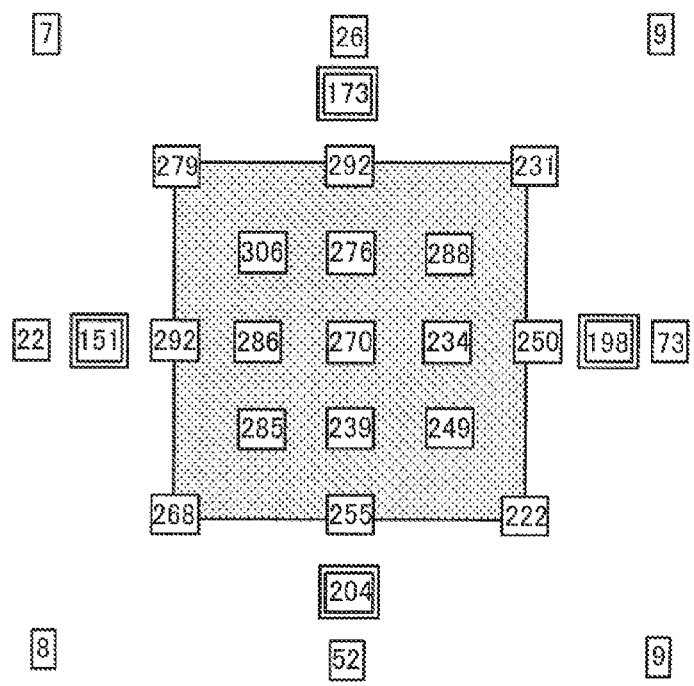
FIG. 20B is a diagram illustrating illuminance distribution when the illumination lens according to Embodiment 1 is used.

As illustrated in FIG. 20A and FIG. 20B, even when illumination lens 100 according to Embodiment 1 is used and even when illumination lens 500 according to Embodiment 2 is used, the inside of a square-shaped surface to be irradiated can be irradiated with light in a substantially uniform manner. On the other hand, parts other than the surface to be irradiated are not nearly irradiated with light. In addition, comparing FIG. 20A and FIG. 20B, when illumination lens 500 according to Embodiment 2 is used, parts other than the surface to be irradiated are further prevented from being irradiated with light than a case where illumination lens 100 according to Embodiment 1 is used, and thus the square-shaped surface to be irradiated is more effectively irradiated. In the measurement results illustrated in FIG. 20A and FIG. 20B, when illuminance values (in the drawing, measurement values surrounded by a double line) of measurement points between an outermost rim of a measurement area and a colored surface to be irradiated are compared with each other, the illuminance values in a case (59 to 131) where illumination lens 500 according to Embodiment 2 is used are lower than those in a case (151 to 204) where illumination lens 100 according to Embodiment 1 is used. This shows that illumination lens 500 according to Embodiment 2 has a greater effect of controlling an irradiation region to a square shape than illumination lens 100 according to Embodiment 1.

[Effects]

Similarly to illumination lens 100, light emitting apparatus 300, and illumination apparatus 400 according to Embodiment 1, illumination lens 500 and light emitting apparatus 600 according to Embodiment 2 and the illumination apparatus (not shown; see FIG. 14) which includes light emitting apparatus 600 according to Embodiment 2 can uniformly and effectively irradiate a square-shaped surface to be irradiated with light that is emitted from light emitting element 200.

Meanwhile, in the above-mentioned embodiments, illumination lenses 100 and 500, light emitting apparatuses 300 and 600, and illumination apparatus 400 which are used to irradiate a square (n-sided polygon: n=4)-shaped surface to be irradiated have been described, but the illumination lens, the light emitting apparatus, and the illumination apparatus of the present invention are not limited thereto. The shape of the surface to be irradiated is not particularly limited as long as it is a polygonal shape (n-sided polygon: n is an integer equal to or greater than 3), and may be a triangular shape (n=3), a pentagonal shape (n=5), a hexagonal shape (n=6), or the like. In this case, the shape of a horizontal section of an incidence surface is substantially similar to the shape (polygonal shape) of the surface to be irradiated.

This application is entitled and claims the benefit of Japanese Patent Application No. 2011-138370 filed on Jun. 22, 2011 and Japanese Patent Application No. 2011-210277 filed on Sep. 27, 2011, the disclosure of which including the specification and drawings is incorporated herein by reference in its entirety.

INDUSTRIAL APPLICABILITY

A light flux controlling member, a light emitting apparatus, and an illumination apparatus of the present invention can uniformly and effectively irradiate a polygonal-shaped surface to be irradiated with light that is emitted from a light emitting element. The light emitting apparatus and the illumination apparatus of the present invention are useful as, for example, lighting for cultivating plants, task lights (table and desk lighting), or reading lights.

REFERENCE SIGNS LIST 10, 100, 500 Illumination lens
11, 110 Incidence surface
111 Concave part
112 Flat surface
113 R surface
12, 120, 510 (510a, 510b) Emission surface
130 Flange
140 Foot
200 Light emitting element
300, 600 Light emitting apparatus
400 Illumination apparatus
410 Surface to be irradiated
CA Central axis

The invention claimed is:

1. A light flux controlling member that controls distribution of light emitted from a light emitting element, the member comprising:
    an incidence surface on which the light emitted from the light emitting element is incident; and
    an emission surface from which the light incident thereon from the incidence surface is emitted toward a surface to be irradiated creating an illumination pattern oriented in a plane orthogonal to an optical axis of the light emitting element, wherein a shape of the illumination pattern is that of an n-sided regular polygon,
    wherein the incidence surface is a pyramidal surface formed in a concave shape with respect to a bottom located on an opposite side to the emission surface, at a position of the bottom which corresponds to the light emitting element, the pyramidal surface being configured such that a boundary between surfaces thereof is an R surface,
    wherein a shape of a cross-section of the incidence surface, the cross-section of the incidence surface being perpendicular to the optical axis of the light emitting element, is substantially similar to the shape of the illumination pattern on the surface to be irradiated,
    wherein a cross-section of the emission surface, the cross-section of the emission surface being perpendicular to the optical axis of the light emitting element, has a shape of an n-sided regular polygon, the n-sided regular polygon being defined by straight lines connecting corners adjacent to each other in n corners respectively corresponding to n corners of the illumination pattern on the surface to be irradiated, and
    wherein sides of the cross-section of the emission surface are substantially parallel to corresponding sides of the cross-section of the incidence surface.

2. The light flux controlling member according to claim 1, wherein in a plurality of surfaces constituting the emission surface, n curved surfaces coming into contact with the optical axis of the light emitting element and respectively corresponding to n flat surfaces constituting the incidence surface are curved surfaces having a convex shape with respect to the flat surface.

3. The light flux controlling member according to claim 2, wherein each of the n curved surfaces is a straight line in the cross-section of the emission surface.

4. The light flux controlling member according to claim 2, wherein a boundary between the n curved surfaces does not have an R surface.

5. A light emitting apparatus comprising:
    the light flux controlling member according to claim 1; and
    a light emitting element,
    wherein the light flux controlling member is disposed in such a manner that an optical axis of the light emitting element passes through an apex of the pyramidal surface.

6. An illumination apparatus comprising:
    the light emitting apparatus according to claim 5; and
    a polygonal-shaped surface to be irradiated which is irradiated with light from the light emitting apparatus,
    wherein the light emitting apparatus is disposed in such a manner that the optical axis of the light emitting element and the surface to be irradiated are perpendicular to each other.

7. A light flux controlling member that controls distribution of light emitted from a light emitting element, the member comprising:
    an incidence surface on which the light emitted from the light emitting element is incident; and
    an emission surface from which the light incident thereon from the incidence surface is emitted toward a surface to be irradiated creating an illumination pattern oriented in a plane orthogonal to an optical axis of the light emitting element, wherein a shape of the illumination pattern is that of an n-sided regular polygon,
    wherein the incidence surface is a pyramidal surface formed in a concave shape with respect to a bottom located on an opposite side to the emission surface, at a position of the bottom which corresponds to the light emitting element, the pyramidal surface being configured such that a boundary between surfaces thereof is an R surface,
    wherein a shape of a cross-section of the incidence surface, the cross-section of the incidence surface being perpendicular to the optical axis of the light emitting element, is substantially similar to the shape of the illumination pattern on the surface to be irradiated,
    wherein a shape of a cross-section of the emission surface, the cross-section of the emission surface being perpendicular to the optical axis of the light emitting element, differs between an irradiation surface side and a bottom side of the emission surface,
    wherein the cross-section of the emission surface on the irradiation surface side has a shape of an n-sided regular polygon, the n-sided regular polygon being defined by straight lines connecting corners adjacent to each other in n corners corresponding to n corners of the illumination pattern on the surface to be irradiated,
    wherein the cross-section of the emission surface on the bottom side has a shape included in an n-sided regular polygon, the n-sided regular polygon being defined by straight lines connecting corners adjacent to each other in n corners corresponding to n corners of the illumination pattern on the surface to be irradiated, and
    wherein sides of the cross-section of the emission surface on the irradiation surface side are substantially parallel to corresponding sides of the cross-section of the incidence surface.

8. The light flux controlling member according to claim 7, wherein in a plurality of surfaces constituting the emission surface, n curved surfaces coming into contact with the optical axis of the light emitting element and respectively corresponding to n flat surfaces constituting the incidence surface are curved surfaces having a convex shape with respect to the flat surface.

9. The light flux controlling member according to claim 8, wherein each of the n curved surfaces is a straight line in the cross-section of the emission surface.

10. The light flux controlling member according to claim 8, wherein a boundary between the n curved surfaces does not have an R surface.

11. A light emitting apparatus comprising:
the light flux controlling member according to claim 7; and
a light emitting element,
wherein the light flux controlling member is disposed in such a manner that an optical axis of the light emitting element passes through an apex of the pyramidal surface.

12. An illumination apparatus comprising:
the light emitting apparatus according to claim 11; and
a polygonal-shaped surface to be irradiated which is irradiated with light from the light emitting apparatus,
wherein the light emitting apparatus is disposed in such a manner that the optical axis of the light emitting element and the surface to be irradiated are perpendicular to each other.

* * * * *